(12) United States Patent
Jahelka et al.

(10) Patent No.: US 11,362,229 B2
(45) Date of Patent: Jun. 14, 2022

(54) EPITAXY-FREE NANOWIRE CELL PROCESS FOR THE MANUFACTURE OF PHOTOVOLTAICS

(71) Applicant: California Institute of Technology, Pasadena, CA (US)

(72) Inventors: Phillip R. Jahelka, Altadena, CA (US); Harry A. Atwater, South Pasadena, CA (US); Wen-Hui Cheng, Pasadena, CA (US); Rebecca D. Glaudell, Sierra Madre, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 16/373,252

(22) Filed: Apr. 2, 2019

(65) Prior Publication Data

US 2019/0312168 A1 Oct. 10, 2019

Related U.S. Application Data

(60) Provisional application No. 62/652,774, filed on Apr. 4, 2018.

(51) Int. Cl.
*H01L 31/0687* (2012.01)
*H01L 21/02* (2006.01)
(Continued)

(52) U.S. Cl.
CPC .. *H01L 31/06875* (2013.01); *H01L 21/02227* (2013.01); *H01L 21/2633* (2013.01); *H01L 31/035227* (2013.01); *H01L 31/1892* (2013.01)

(58) Field of Classification Search
CPC ........ H01L 31/06875; H01L 31/0304–03048; H01L 31/0352; H01L 31/035281;
(Continued)

(56) References Cited

U.S. PATENT DOCUMENTS 3,278,811 A 10/1966 Hiroshi
4,621,898 A 11/1986 Cohen
(Continued)

FOREIGN PATENT DOCUMENTS

CN 101598717 A 12/2009
WO 2016111576 A1 7/2016
(Continued)

OTHER PUBLICATIONS

International Search Report and Written Opinion for International Application No. PCT/US2019/012916, Search completed May 3, 2019, dated May 7, 2019, 10 pgs.
(Continued)

*Primary Examiner* — Andrew J Golden
(74) *Attorney, Agent, or Firm* — KPPB LLP

(57) ABSTRACT

Photovoltaics configured to be manufactured without epitaxial processes and methods for such manufacture are provided. Methods utilize bulk semiconducting crystal substrates, such as, for example, GaAs and InP such that epitaxy processes are not required. Nanowire etch and exfoliation processes are used allowing the manufacture of large numbers of photovoltaic cells per substrate wafer (e.g., greater than 100). Photovoltaic cells incorporate electron and hole selective contacts such that epitaxial heterojunctions are avoided during manufacture.

19 Claims, 11 Drawing Sheets

(51) Int. Cl.
*H01L 31/0352* (2006.01)
*H01L 21/263* (2006.01)
*H01L 31/18* (2006.01)

(58) Field of Classification Search
CPC ..... H01L 31/035209; H01L 31/035227; H01L 31/1896; H01L 31/1892
USPC ........................................................ 136/255
See application file for complete search history.

(56) References Cited

U.S. PATENT DOCUMENTS

| | | | |
|---|---|---|---|
| 4,771,017 A | 9/1988 | Tobin et al. | |
| 5,075,262 A | 12/1991 | Nguyen et al. | |
| 5,076,857 A | 12/1991 | Nowlan | |
| 5,122,215 A | 6/1992 | Shibata et al. | |
| 6,473,220 B1 | 10/2002 | Clikeman et al. | |
| 6,573,445 B1 | 6/2003 | Burgers | |
| 6,768,048 B2 | 7/2004 | Woll et al. | |
| 7,573,550 B2 | 8/2009 | Lubart et al. | |
| 7,595,934 B2 | 9/2009 | Lubart et al. | |
| 8,202,566 B2 | 6/2012 | Davidson et al. | |
| 8,648,248 B2 | 2/2014 | Rodriguez-parada et al. | |
| 9,750,141 B2 | 8/2017 | Noy | |
| 11,041,338 B2 | 6/2021 | Saive et al. | |
| 2003/0041894 A1 | 3/2003 | Sverdrup, Jr. et al. | |
| 2005/0109388 A1 | 5/2005 | Murakami et al. | |
| 2006/0038182 A1* | 2/2006 | Rogers | H01L 31/1896 257/77 |
| 2006/0207647 A1* | 9/2006 | Tsakalakos | H01L 31/035227 136/256 |
| 2006/0283498 A1 | 12/2006 | Gronet | |
| 2007/0281099 A1 | 12/2007 | Howarth et al. | |
| 2008/0072958 A1* | 3/2008 | Dutta | H01L 31/035281 136/256 |
| 2008/0135089 A1* | 6/2008 | Tsakalakos | H01L 31/0352 136/248 |
| 2008/0176030 A1 | 7/2008 | Fonash et al. | |
| 2008/0271776 A1 | 11/2008 | Morgan | |
| 2009/0061213 A1 | 3/2009 | Bahnmuller et al. | |
| 2009/0151782 A1 | 6/2009 | Ko et al. | |
| 2009/0165844 A1* | 7/2009 | Dutta | H01L 31/035281 136/255 |
| 2009/0229667 A1 | 9/2009 | Shrotriya et al. | |
| 2009/0255568 A1 | 10/2009 | Morgan | |
| 2009/0293946 A1* | 12/2009 | Lin | H01L 51/4266 136/255 |
| 2010/0055824 A1* | 3/2010 | Lin | H01L 31/1892 438/73 |
| 2010/0075261 A1 | 3/2010 | Clevenger et al. | |
| 2010/0089262 A1 | 4/2010 | Seong et al. | |
| 2010/0116316 A1 | 5/2010 | Moslehi et al. | |
| 2010/0283069 A1 | 11/2010 | Rogers et al. | |
| 2010/0307572 A1* | 12/2010 | Bedell | H01L 31/1892 136/255 |
| 2011/0120527 A1 | 5/2011 | Huang et al. | |
| 2011/0175085 A1* | 7/2011 | Tiwari | H01L 31/035281 257/53 |
| 2011/0226332 A1 | 9/2011 | Ford et al. | |
| 2011/0240104 A1* | 10/2011 | Lee | H01L 31/035281 136/252 |
| 2011/0315201 A1* | 12/2011 | Lin | H01L 31/035227 136/255 |
| 2011/0315988 A1* | 12/2011 | Yu | H01L 31/02168 257/52 |
| 2012/0031486 A1 | 2/2012 | Parce et al. | |
| 2012/0067400 A1 | 3/2012 | Derryberry et al. | |
| 2012/0067402 A1 | 3/2012 | Kitai et al. | |
| 2012/0132278 A1 | 5/2012 | Winston et al. | |
| 2012/0229907 A1 | 9/2012 | Ueda et al. | |
| 2013/0014811 A1* | 1/2013 | Bedell | H01L 31/03046 136/255 |
| 2013/0074918 A1 | 3/2013 | Jeong et al. | |
| 2013/0210185 A1 | 8/2013 | Yoshimi et al. | |
| 2014/0000692 A1 | 1/2014 | Fogel et al. | |
| 2014/0029104 A1 | 1/2014 | Guo et al. | |
| 2014/0130864 A1 | 5/2014 | Lunt et al. | |
| 2014/0154769 A1 | 6/2014 | Del Ninno et al. | |
| 2014/0182656 A1 | 7/2014 | Bodan et al. | |
| 2014/0283896 A1 | 9/2014 | Lunt, III et al. | |
| 2014/0299181 A1* | 10/2014 | Bedell | H01L 31/0304 136/255 |
| 2015/0311370 A1 | 10/2015 | Chou et al. | |
| 2016/0087135 A1 | 3/2016 | Horimai et al. | |
| 2016/0302305 A1 | 10/2016 | Chang et al. | |
| 2016/0313640 A1 | 10/2016 | Cok et al. | |
| 2016/0322514 A1 | 11/2016 | Atwater et al. | |
| 2017/0038047 A1 | 2/2017 | Golle et al. | |
| 2017/0179041 A1 | 6/2017 | Dias et al. | |
| 2017/0263796 A1 | 9/2017 | Jahelka | |
| 2017/0373206 A1* | 12/2017 | Knorr, Jr. | H01L 31/186 |
| 2018/0248064 A1 | 8/2018 | Lunt et al. | |
| 2018/0337297 A1 | 11/2018 | Murofushi et al. | |
| 2019/0067504 A1 | 2/2019 | Needell et al. | |
| 2019/0074401 A1 | 3/2019 | Saive et al. | |
| 2019/0148574 A1 | 5/2019 | Saive et al. | |
| 2019/0326460 A1 | 10/2019 | Needell et al. | |
| 2020/0028005 A1 | 1/2020 | Saive et al. | |
| 2020/0241186 A1 | 7/2020 | Ohta et al. | |

FOREIGN PATENT DOCUMENTS

| | | |
|---|---|---|
| WO | 2019035094 A1 | 2/2019 |
| WO | 2019099733 A1 | 5/2019 |
| WO | 2019139996 A1 | 7/2019 |
| WO | 2019204809 A1 | 10/2019 |

OTHER PUBLICATIONS

International Search Report and Written Opinion for International Application No. PCT/IB2018/056249, Search completed Nov. 8, 2018, dated Dec. 20, 2018, 14 pgs.

International Search Report and Written Opinion for International Application No. PCT/US2019/028522, Search completed Sep. 4, 2019, dated Sep. 4, 2019, 8 pgs.

International Search Report and Written Opinion for International Application No. PCT/US2018/061373, Search completed Mar. 6, 2019, dated Mar. 7, 2019, 10 pgs.

Aberg et al., "A GaAs Nanowire Array Solar Cell With 15.3% Efficiency at 1 Sun", IEEE Journal of Photovoltaics, Oct. 14, 2015, vol. 6, No. 1, pp. 185-190, doi: 10.1109/JPHOTOV.2015.2484967.

Adams et al., "Are global wind power resource estimates overstated?", Environmental Research Letters, Feb. 25, 2013, vol. 8, No. 1, 15021, doi: 10.1088/1748-9326/8/1/015021.

Afshinmanesh et al., "Transparent metallic fractal electrodes for semiconductor devices", Nano letters, Aug. 20, 2014, vol. 14, pp. 5068-5074.

Andrews et al., "The Effect of Spectral Albedo on Amorphous Silicon and Crystalline Silicon Solar Photovoltaic Device Performance", Solar Energy, vol. 91, Mar. 22, 2013, pp. 233-241.

Arora et al., "Perovskite solar cells with CuSCN hole extraction layers yield stabilized efficiencies greater than 20%", Science, Nov. 10, 2017, vol. 358, No. 6364, pp. 768-771, doi: 10.1126/science.aam5655.

Baruch et al., "On some thermodynamic aspects of photovoltaic solar energy conversion", Solar Energy Materials and Solar Cells, vol. 36, No. 2, Feb. 1995, pp. 201-222.

Batchelder et al., "The Luminescent Solar Concentrator", Thesis, California Institute of Technology, 1982, 287 pgs.

Blakers, "Shading losses of solar-cell metal grids", Journal of Applied Physics, May 15, 1992, vol. 71, No. 10, pp. 5237-5241, published online Jun. 4, 1998.

Bomm et al., "Fabrication and spectroscopic studies on highly luminescent CdSe/CdS nanorod polymer composites", Beilstein Journal of Nanotechnology, vol. 1, No. 1, Nov. 29, 2010, pp. 94-100.

Brennan et al., "Effects of Spectral Albedo on Solar Photovoltaic Devices", Solar Energy Materials and Solar Cells, vol. 124, Feb. 19, 2014, pp. 111-116.

(56) References Cited

OTHER PUBLICATIONS

Bronstein et al., "Luminescent Solar Concentration with Semiconductor Nanorods and Transfer-Printed Micro-Silicon Solar Cells", ACS Nano, vol. 8, No. 1, Jan. 28, 2014, pp. 44-53.
Bronstein et al., "Quantum Dot Luminescent Concentrator Cavity Exhibiting 30-fold Concentration", ACS Phototonics, vol. 2, No. 11, Aug. 17, 2015, pp. 1576-1583.
Burgers, "How to Design Optimal Metallization Patterns for Solar Cells", Progress in Photovoltaics: Research and Applications, May 4, 1999, vol. 7, pp. 457-461, http://www.ecn.nl/docs/library/report/1999/rx99023.pdf.
Carlson et al., "Transfer printing techniques for materials assembly and micro/nanodevice fabrication", Advanced Materials, vol. 24, No. 39, Oct. 9, 2012, Electronic Publication: Aug. 31, 2012, pp. 5284-5318.
Chen et al., "Compact high-quality CdSe—CdS core-shell nanocrystals with narrow emission linewidths and suppressed blinking", Nature Materials, vol. 12, No. 5, May 2013, Electronic Publication: Feb. 3, 2013, pp. 445-451.
Chen et al., "Increasing light capture in silicon solar cells with encapsulants incorporating air prisms to reduce metallic contact losses", Optics Express, vol. 24, No. 22, Oct. 31, 2016, published Sep. 30, 2016, 12 pgs.
Coropceanu et al., "Core/shell quantum dot based luminescent solar concentrators with reduced reabsorption and enhanced efficiency", Nano Letters, vol. 14, No. 7, Jul. 9, 2014, Electronic Publication: Jun. 6, 2014, pp. 4097-4101.
Cuevas et al., "50 Per cent more output power from an albedo-collecting flat panel using bifacial solar cells", Solar Energy, vol. 29, No. 5, 1982, pp. 419-420.
De Souza et al., "Inversion mode n-channel GaAs field effect transistor with high-k/metal gate", Applied Physics Letters, Apr. 16, 2008, vol. 92, No. 15, pp. 153508-1-153508-2, https://doi.org/10.1063/1.2912027.
Debije et al., "Thirty Years of Luminescent Solar Concentrator Research: Solar Energy for the Built Environment", Advanced Energy Materials, vol. 2, No. 1, 2012, pp. 12-35.
Deline et al., "Evaluation and Field Assessment of Bifacial Photovoltaic Module Power Rating Methodologies", IEEE 43rd Photovoltaic Specialists Conference (PVSC), Portland, Oregon, Jun. 5-10, 2016, 6 pgs.
Ellmer, "Past achievements and future challenges in the development of optically transparent electrodes", Nature Photonics, Nov. 30, 2012, vol. 6, pp. 809-817.
Essig et al., "Mechanically stacked 4-terminal III-V/Si tandem solar cells", Conference paper, Jun. 2017, 2 pgs.
Essig et al., "Realization of GaInP/Si dual-junction solar cells with 29.8% one-sun efficiency", IEEE Journal of Photovoltaics, vol. 6, No. 4, Jul. 2016, Date of Publication: Apr. 27, 2016, 7 pgs.
Feldmann et al., "Carrier-selective contacts for Si solar cells", Applied Physics Letters, vol. 104, No. 18, May 8, 2014, pp. 181105-1-181105-4.
Ferry et al., "Light trapping in ultrathin plasmonic solar cells", Optics Express, Jun. 24, 2010, vol. 18, pp. A237-A245.
Fertig et al., "Bifacial potential of single- and double-sided collecting silicon solar cells", Progress in Photovoltaics: Research and Applications, vol. 24, No. 6, Jan. 13, 2016, pp. 818-829.
Fertig et al., "Economic feasibility of bifacial silicon solar cells", Progress in Photovoltaics: Research and Applications, vol. 24, No. 6, Jan. 14, 2016, pp. 800-817.
Fraunhofer, "Photovoltaics Report", Fraunhofer ISE, Freiburg, 2014, 44 pgs.
Gallagher et al., "Quantum dot solar concentrator behaviour, predicted using a ray trace approach", International Journal of Ambient Energy, vol. 25, No. 1, Jan. 2004, pp. 47-56.
Gangopadhyay et al., "Front Grid Design For Plated Contact Solar Cells", IEEE, 399-402, 2002.
Geisz et al., "Enhanced external radiative efficiency for 20.8% efficient single-junction GaInP solar cells", Applied Physical Letters, vol. 103, No. 4, Jul. 25, 2013, pp. 041118-1-041118-5.

Goetzberger et al., "Solar Energy Conversion with Fluorescent Collectors", Applied Physics, vol. 14, No. 2, Oct. 1977, pp. 123-129.
Goldschmidt et al., "Increasing the efficiency of fluorescent concentrator systems", Solar Energy Materials and Solar Cells, vol. 93, No. 2, Feb. 2009, pp. 176-182, available online Nov. 20, 2008.
Green, "Self-consistent optical parameters of intrinsic silicon at 300 K including temperature coefficients", Solar Energy Materials and Solar Cells, vol. 92, No. 11, Nov. 2008, pp. 1305-1310.
Guerrero-Lemus et al., "Bifacial solar photovoltaics—A technology review", Renewable and Sustainable Energy Reviews, Mar. 8, 2016, vol. 60, pp. 1533-1549.
Guo et al., "Vertically mounted bifacial photovoltaic modules: A global analysis", Energy, vol. 61, Nov. 1, 2013, pp. 447-454, available online Sep. 23, 2013.
Gutmann et al., "Predicting the performance of photonic luminescent solar concentrators", IEEE Photovoltaic Specialists Conference, Jun. 16-21, 2013, pp. 1864-1868.
Rodriguez, "Bifacial solar cells—the two sides of the story", Solar Choice News, New Technologies May 5, 2015, Retrieved from https://www.solarchoice.net.au/blog/news/bifacial-solar-cells-the-two-sides-of-the-story-050515, 7 pgs.
Romer et al., "Ion Implantation for Poly-Si Passivated Back-Junction Back-Contacted Solar Cells", IEEE Journal of Photovoltaics, vol. 5, No. 2, Mar. 2015, pp. 507-514.
Rowan et al., "Advanced Material Concepts for Luminescent Solar Concentrators", IEEE Journal of Selected Topics in Quantum Electronics, vol. 14, No. 5, Nov. 2008, pp. 1312-1322.
Rowell et al., "Transparent electrode requirements for thin film solar cell modules", Energy & Environmental Science, 2011, vol. 4, pp. 131-134.
Russell et al., "The Influence of Spectral Albedo on Bifacial Solar Cells: A Theoretical and Experimental Study", IEEE Journal of Photovoltaics, vol. 7, No. 6, Nov. 2017, pp. 1611-1618.
Sahin et al., "Monte-Carlo simulation of light propagation in luminescent solar concentrators based on semiconductor nanoparticles", Journal of Applied Physics, vol. 110, No. 3, Aug. 11, 2011, pp. 03108-1-033108-8.
Saive et al., "Effectively Transparent Contacts (ETCs) for Solar Cells", IEEE 43rd Photovoltaic Specialists Conference, Date of Conference: Jun. 5-10, 2016, Portland, Oregon, 4 pgs.
Saive et al., "Effectively Transparent Front Contacts for Optoelectronic Devices", Advanced Optical Materials, 2016, 5 pgs.
Saive et al., "Enhanced Light Trapping in Thin Silicon Solar Cells using Effectively Transparent Contacts (ETCs)", 44th IEEE Photovoltaic Specialist Conferences, Aug. 2017, 5 pgs.
Saive et al., "Enhancing the Power Output of Bifacial Solar Modules by Applying Effectively Transparent Contacts (ETCs) With Light Trapping", IEEE Journal of Photovoltaics, 2018, 7 pgs.
Saive et al., "Light Trapping in Bifacial Solar Modules Using Effectively Transparent Contacts (ETCs)", 45th IEEE Photovoltaic Specialist Conference, Aug. 2018, 3 pgs.
Saive et al., "Mesoscale trumps nanoscale: metallic mesoscale contact morphology for improved light trapping, optical absorption and grid conductance in silicon solar cells", Optics Express, vol. 26, No. 6, Mar. 19, 2018, 8 pgs.
Saive et al., "Silicon heterojunction solar cells with effectively transparent front contacts", Royal Society of Chemistry, Feb. 27, 2017, 6 pgs.
Saive et al., "Three-dimensional nanoimprint lithography using two-photon lithography master samples", ArVix, Feb. 2017, 4 pgs.
Saive et al., "Transparent, Conductive and Lightweight Superstrates for Perovskite Solar Cells and Modules", 45th IEEE Photovoltaic Specialist Conference, Aug. 2018, 5 pgs.
Sanyo Energy Corp, "Bifacial Photovoltaic Module", Hit photovoltaic module double, Jan. 9, 2008, 2 pgs.
Sark et al., "Luminescent Solar Concentrators: The route to 10% efficiency", IEEE Photovoltaic Specialist Conference, Jun. 8-13, 2014, pp. 2276-2278.
Sheldon et al., "Evaluation of ITO/GaAs solar cells", Journal of Vacuum Science and Technology, 1982, vol. 20, No. 3, pp. 410-413, doi: 10.1116/1.571479.

(56) References Cited

OTHER PUBLICATIONS

Shockley et al., "Detailed Balance Limit of Efficiency of p-n Junction Solar Cells", Journal of Applied Physics, vol. 32, No. 3, Mar. 1961, pp. 510-519.
Sholin et al., "Semiconducting polymers and quantum dots in luminescent solar concentrators for solar energy harvesting", Journal of Applied Physics, vol. 101, No. 12, Jun. 28, 2007, pp. 123114-1-123114-9.
Slooff et al., "A Luminescent Solar Concentrator with 7.1% power conversion efficiency", Phys. Status Solid—Rapid Res. Letter, vol. 2, No. 6, 2008, pp. 257-259, published online Sep. 6, 2008.
Soderstrom et al., "Smart Wire Connection Technology", 28th European Photovoltaic Solar Energy Conference and Exhibition, Session 1CV.2.17, 2013, pp. 495-499.
Soria et al., "A study of the annual performance of bifacial photovoltaic modules in the case of vertical facade integration", Energy Science & Engineering, vol. 4, No. 1, Nov. 26, 2015, pp. 52-68.
Sze et al., "Physics of semiconductor devices", Hoboken, NJ, Wiley—Interscience, 2007, 763 pgs. (presented in 3 parts).
Taguchi et al., "24.7% record efficiency HIT solar cell on thin silicon wafer", IEEE Journal of Photovoltaics, Jan. 2014, vol. 4, pp. 96-99.
Valdivia et al., "Bifacial Photovoltaic Module Energy Yield Calculation and Analysis", IEEE PVSC 2017 Conference Proceedings, 2017, pp. 1094-1099.
Van Dam et al., "High-Efficiency Nanowire Solar Cells with Omnidirectionally Enhanced Absorption Due to Self-Aligned Indium-Tin-Oxide Mie Scatterers", ACS Nano, Nov. 29, 2016, vol. 10, No. 12, pp. 11414-11419, doi: 10.1021/acsnano.6b06874.
Van De Groep et al., "Transparent Conducting Silver Nanowire Networks", Nano Letters, May 3, 2012, vol. 12, pp. 3138-3144, doi:10.1021/n1301045a.
Vest et al., "Levelized Cost and Levelized Avoided Cost of New Generation Resources in the Annual Energy Outlook 2016", U.S. Energy Information Administration, Aug. 2016, 20 pgs.
Vogt, "Development of Physical Models for the Simulation of Optical Properties of Solar Cell Modules", Hannover, Leibniz Information Centre For Science and Technology University Library, Thesis, 2015, 161 pgs.
Vogt et al., "Measurement of the Optical Constants of Soda-Lime Glasses in Dependence of Iron Content and Modeling of Iron-Related Power Losses in Crystalline Si Solar Cell Modules", IEEE Journal of Photovoltaics, vol. 6, No. 1, Nov. 19, 2015, pp. 111-118.
Vogt et al., "Optical Constants of UV Transparent EVA and the Impact on the PV Module Output Power under Realistic Irradiation", Energy Procedia, vol. 92, Aug. 2016, pp. 523-530.
Wallentin et al., "InP Nanowire Array Solar Cells Achieving 13.8% Efficiency by Exceeding the Ray Optics Limit", Science, Mar. 1, 2013, vol. 339, No. 6123, pp. 1057-1060, doi: 10.1126/science.1230969.
Ward et al., "High aspect ratio electrodeposited Ni/Au contacts for GaAs-based III-V concentrator solar cells", Progress in Photovoltaics: Research and Applications, No. 23, 2015, Published online Mar. 20, 2014, pp. 646-653.
Wheeler et al., "Switchable Photovoltaic Windows Enabled by Reversible Photothermal Complex Dissociate from Methylammonium Lead Iodide", Nature Communications, vol. 8, No. 1722, 2017, pp. 1-9.
Wittwer et al., "Fluorescent Planar Concentrators", Solar Energy Materials and Solar Cells, vol. 11, No. 3, 1984, pp. 187-197.
Woodhouse et al., "A Manufacturing Cost Analysis Relevant to Single- and Dual-Junction Photovoltaic Cells Fabricated with III-Vs and III-Vs Grown on Czochralski Silicon", National Renewable Energy Lab, Sep. 30, 2013, 92 pgs.
Wurfel et al., "Charge Carrier Separation in Solar Cells", IEEE Journal of Photovoltaics, Nov. 20, 2014, vol. 5, No. 1, pp. 461-469, doi: 10.1109/JPHOTOV.2014.2363550.
Xie et al., "InAs/InP/ZnSe core.shell/shell quantum dots as near-infrared emitters: Bright, narrow-band, non-cadmium containing, and biocompatible", Nano Research, vol. 1, No. 6, 2008, pp. 457-464.

Yablonovitch, "Statistical ray optics", Journal of the Optical Society of America, vol. 72, No. 7, Jul. 1982, pp. 899-907.
Yablonovitch, "Thermodynamics of the fluorescent planar concentrator", Journal of the Optical Society of America, vol. 70, No. 11, Nov. 1980, pp. 1362-1363.
Yin et al., "19.2% Efficient InP Heterojunction Solar Cell with Electron-Selective TiO2 Contact", ACS Photonics, Sep. 25, 2014, vol. 1, No. 12, pp. 1245-1250, doi: 10.1021/ph500153c.
Yu et al., "Selecting tandem partners for silicon solar cells", Nature Energy, Nov. 2016, vol. 1, No. 11, Article 16137, pp. 1-4, published Sep. 26, 2016, doi: 10.1038/nenergy.2016.137.
Yusufoglu et al., "Analysis of the Annual Performance of Bifacial Modules and Optimization Methods", IEEE Journal of Photovoltaics, vol. 5, No. 1, Nov. 20, 2014, pp. 320-328.
Zheng et al., "Graphene oxide-based transparent conductive films", Progress in Materials Science, Mar. 25, 2014, vol. 64, pp. 200-247.
Zhou et al., "Near Infrared, Highly Efficient Luminescent Solar Concentrators", Advanced Energy Materials, vol. 6, No. 11, Jun. 8, 2016, pp. 1-8.
International Preliminary Report on Patentability for International Application No. PCT/US2019/012916, Report dated Jul. 14, 2020, dated Jul. 23, 2020, 7 Pgs.
Hansen et al., "Analysis of Irradiance Models for Bifacial PV Modules", IEEE 43rd Photovoltaic Specialists Conference (PVSC), Portland, Oregon, Jun. 5-10, 2016, 6 pgs.
Henry et al., "Alumina etch masks for fabrication of high-aspect-ratio silicon micropillars and nanopillars", Nanotechnology, Jun. 2, 2009, vol. 20, 255305, 4 pgs.
Henry, "ICP etching of silicon for micro and nanoscale devices", Thesis, California Institute of Technology, May 19, 2010, 219 pgs. (presented in two parts).
Herasimenka et al., "> 750 mV open circuit voltage measured on 50 µm thick silicon heterojunction solar cell", Applied Physics Letters, Aug. 1, 2013, vol. 103, pp. 053511-1-053511-4.
Hinkle et al., "Detection of Ga suboxides and their impact on III-V passivation and Fermi-level pinning", Applied Physics Letters, Apr. 20, 2009, vol. 94, No. 16, pp. 162101-1-162101-3, doi: 10.1063/1.3120546.
Holman et al., "Current losses at the front of silicon heterojunction solar cells", IEEE Journal of Photovoltaics, Jan. 2012, vol. 2, No. 1, pp. 7-15.
Honsberg et al., PVCDROM, http://pveducation.org/pvcdrom, Jan. 5, 2015, 1 pg.
Horzel et al., "Advantages of a new metallisation structure for the front side of solar cells", 13th European Photovoltaic Solar Energy Conference, Oct. 23-27, 1995, pp. 1368-1373.
Hoye et al., "Strongly Enhanced Photovoltaic Performance and Defect Physics of Air-Stable Bismuth Oxyiodide (BiOI)", Advanced Materials, Jul. 17, 2017, vol. 29, No. 36, 1702176, 10 pgs., doi: 10.1002/adma.201702176.
Hsu et al., "Performance enhancement of metal nanowire transparent conducting electrodes by mesoscale metal wires", Nature Communications, Sep. 25, 2013, vol. 4, No. 2522, pp. 1-7.
Hu et al., "Ray-trace simulation of CuInS(Se)_2 quantum dot based luminescent solar concentrators", Optics Express, vol. 23, No. 15, Jul. 27, 2015, pp. A858-A867.
Huang et al., "Fabrication of Silicon Nanowire Arrays with Controlled Diameter, Length, and Density", Advanced Materials, Feb. 7, 2007, vol. 19, No. 5, pp. 744-748, doi: 10.1002/adma.200600892.
Jasieniak et al., "Re-examination of the Size-Dependent Absorption Properties of CdSe Quantum Dots", Journal of Physical Chemistry, vol. 113, No. 45, Oct. 15, 2009, pp. 19468-19474.
Jiang et al., "Enhanced electron extraction using SnO2 for highefficiency planar-structure HC(NH2)2PbI3-based perovskite solar cells", Nature Energy, Nov. 14, 2016, vol. 2, Issue 16177, 7 pgs., doi: 10.1038/nenergy.2016.177.
Kelzenberg, "Silicon microwire photovoltaics", Thesis, California Institute of Technology, May 19, 2010, 324 pgs., (presented in tow parts).
Kik et al., "Catoptric electrodes: transparent metal electrodes using shaped surfaces", Optics Letters, vol. 39, No. 17, Sep. 1, 2014, pp. 5114-5117.

(56) References Cited

OTHER PUBLICATIONS

King, "Photovoltaic Module and Array Performance Characterization Methods for All System Operating Conditions", AIP Conference Proceedings, vol. 394, No. 1, May 12, 2008, 22 pgs.

Klein et al., "Transparent Conductive Adhesives for Tandem Solar Cells Using Polymer—Particle Composites", ACS Applied Materials & Interfaces, 2008, No. 10, pp. 8086-8091.

Kopecek et al., "Bifaciality: One small step for technology, one giant leap for kWh cost reduction", Photovoltaics International, vol. 26, 2014, 11 pgs.

Kreinin et al., "PV systems based on bifacial modules: Performance simulation vs. design factors", IEEE 43rd Photovoltaic Specialists Conference (PVSC), Portland, Oregon, Jun. 5-10, 2016, pp. 2688-2691.

Krenzinger et al., "Estimation of Radiation Incident on Bifacial Albedo-Collecting Panels", International Journal of Solar Energy, vol. 4, No. 5, 1986, pp. 297-319.

Kuang et al., "A New Architecture for Transparent Electrodes: Relieving the Trade-Off Between Electrical Conductivity and Optical Transmittance", Advanced Materials, No. 23, 2011, pp. 2469-2473.

Lai et al., "Schottky Barrier Catalysis Mechanism in Metal-Assisted Chemical Etching of Silicon", ACS Applied Materials & Interfaces, Mar. 28, 2016, vol. 8, No. 14, pp. 8875-8879. doi: 10.1021/acsami.6b01020.

Levy et al., "Rapid and precise calculations of energy and particle flux for detailed-balance photovoltaic applications", Solid-State Electronics, vol. 50, No. 7-8, Jul.-Aug. 2006, pp. 1400-1405.

Lo et al., "New integrated simulation tool for the optimum design of bifacial solar panel with reflectors on a specific site", Renewable Energy, vol. 81, Sep. 2015, pp. 293-307.

Lohmüller et al., "The HIP-MWT+ solar cell concept on n-type silicon and metallization-induced voltage losses", 29th European PV Solar Energy Conference and Exhibition, Amsterdam, The Netherlands, Sep. 22-26, 2014, 7 pgs.

Lossen et al., "Double Printing nPERT Cells with Narrow Contact Layers", Energy Procedia, vol. 92, Aug. 2016, pp. 939-948.

Ma et al., "Enhancement of photovoltaic cell response due to high-refractive-index encapsulants", Journal of Applied Physics, Aug. 18, 2010, vol. 108, pp. 043102-1-043102-3, http://www.ecse.rpiscrews.us/~schubert/Reprints/2010-Ma-Ming-et-al-%28JAP%29-Enhancement-of-photovoltaic-cell-response-due-to-high-refractive-index-encapsulants.pdf.

Madrid et al., "Investigation of the Efficiency Boost Due to Spectral Concentration in a Quantum-Dot Based Luminescent Concentrator", IEEE World Conference on Photovoltaic Energy Conference, May 7-12, 2006, pp. 154-157.

Martinez et al., "Design, fabrication, and characterization of a luminescent solar concentrator with optimized optical concentration through minimization of optical losses", Journal of Photonics for Energy, vol. 6, No. 4, Nov. 30, 2016, pp. 045504-1-045501-11.

Masuko, et al., "Achievement of more than 25% conversion efficiency with crystalline silicon heterojunction solar cell", IEEE Journal of Photovoltaics, Nov. 2014, vol. 4, pp. 1433-1435.

McIntosh et al., "OPAL 2: Rapid Optical Simulation of Silicon Solar Cells", 38th IEEE Photovoltaic Specialists Conference, Austin, Texas, Jun. 3-8, 2012, 8 pgs.

Meinardi et al., "Highly efficient luminescent solar concentrators based on earth-abundant indirect-bandgap silicon quantum dots", Nature Photonics, vol. 11, No. 3, Mar. 1, 2017, pp. 177-185.

Meinardi et al., "Large-area luminescent solar concentrators based on 'Stokes-shift-engineered' nanocrystals in a mass-polymerized PMMA matrix", Nature Photonics, vol. 8, No. 5, Apr. 13, 2014, pp. 392-399.

Mittag et al., "Triangular Ribbons for Improved Module Efficiency", 32nd European PV Solar Energy Conference and Exhibition, Jun. 20-24, 2016, Munich, Germany, 4 pgs.

Narasimhan et al., "Hybrid Metal—Semiconductor Nanostructure for Ultrahigh Optical Absorption and Low Electrical Resistance at Optoelectronic Interfaces", ACS Nano, vol. 9, No. 11, Oct. 8, 2015, pp. 10590-10597.

Needell et al., "Micro-optical Tandem Luminescent Solar Concentrators", arXiv:1710.00034v1, Sep. 5, 2017, 10 pgs.

Padmanabhan et al., "Light-induced degradation and regeneration of multicrystalline silicon Al-BSF and PERC solar cells", Physica Status Solidi: Rapid Research Letters, vol. 10, No. 12, Dec. 2016, Online Publication Nov. 16, 2016, pp. 874-881.

Papakonstantinou et al., "Fundamental limits of concentration in luminescent solar concentrators revised: the effect of reabsorption and nonunity quantum yield", Optica, vol. 2, No. 10, Oct. 2015, pp. 841-849.

Papet et al., "19% Efficiency Module Based on Roth&Rau Heterojunction Solar Cells and Day4™ Energy Module Concept", 26th European Photovoltaic Solar Energy Conference and Exhibition, Session 4AV.1.13, 2011, pp. 3336-3339.

Powell et al., "The capital intensity of photovoltaics manufacturing: barrier to scale and opportunity for innovation", Energy & Environmental Science, 2015, vol. 8, No. 12, pp. 3395-3408, doi: 10.1039/C5EE01509J.

Rahman et al., "Efficient tool flow for 3D photovoltaic modelling", Computer Physics Communications, Mar. 30, 2015, vol. 193, pp. 124-130, doi: 10.1016/j.cpc.2015.03.016.

Rau et al., "Thermodynamics of light management in photovoltaic devices", Physical Review B, vol. 90, No. 3, Jul. 15, 2014, pp. 035211-1-035211-16.

Ravikumar, "Photovoltaic Capacity Additions: The optimal rate of deployment with sensitivity to time-based GHG emissions", Thesis, Dec. 2013, Arizona State University, 50 pgs.

Richards et al., "Overcoming the Poor Short Wavelength Spectral Response of CdS/CdTe Photovoltaic Modules via Luminescence Down-Shifting: Ray-Tracing Simulations", Progress in Photovoltaics, vol. 15, No. 1, Jan. 2007, pp. 27-34, published online Sep. 20, 2006.

Arvo, "Backward ray tracing", Developments in Ray Tracing, Computer Graphics, Proc. of ACM SIGGRAPH 86 Course Notes, 1986, pp. 259-263.

Divitt et al., "Spatial coherence of sunlight and its implications for light management in photovoltaics", Optica, Jan. 27, 2015, vol. 2, No. 2, pp. 95-103, doi: 10.1364/OPTICA.2.000095.

Goncharov et al, "Reconstruction of the optical system of the human eye with reverse ray-tracing", Optics express, Feb. 4, 2008, vol. 16, No. 3, pp. 1692-1703.

Morales-Masis et al, "Transparent electrodes for efficient optoelectronics", Advanced Electronic Materials 3, No. 5 (2017): 1600529.

Niu et al, "High order diffraction suppression by quasi-periodic two-dimensional gratings", Optical Materials Express, Feb. 1, 2017, vol. 7, No. 2, pp. 366-375, doi: 10.1364/OME.7.000366.

Saive et al, "Effectively transparent contacts (ETCs) for solar cells", Photovoltaic Specialists Conference (PVSC), 2016 IEEE 43rd, 2016, pp. 3612-3615: IEEE.

Saive et al, "Effectively transparent front contacts for optoelectronic devices", Advanced Optical Materials, Jun. 10, 2016, vol. 4, No. 10, pp. 1470-1474, doi: 10.1002/adom.201600252.

Saive et al, "Enhancing the Power Output of Bifacial Solar Modules by Applying Effectively Transparent Contacts (ETCs) With Light Trapping", IEEE Journal of Photovoltaics, Sep. 2018, vol. 8, No. 5, pp. 1183-1189.

Saive et al, "Silicon heterojunction solar cells with effectively transparent front contacts", Sustainable Energy & Fuels, 2017, vol. 1, pp. 593-598.

Saive et al., "Mesoscale trumps nanoscale: metallic mesoscale contact morphology for improved light trapping, optical absorption and grid conductance in silicon solar cells", Optics Express, Mar. 6, 2018, vol. 26, No. 6, pp. A275-A282, doi: 10.1364/OE.26.00A275.

Saive et al., "Three-dimensional nanoimprint lithography using two-photon lithography master samples", arXiv preprint arXiv:1702.04012v1, 2017.

Unknown Author, "Bright Green Tree—Waikato", https://commons.wikimedia.org/wiki/File:Bright_green_tree_-_Waikato.jpg, Dec. 9, 2005.

(56) References Cited

OTHER PUBLICATIONS

Wang et al, "Image quality assessment: from error visibility to structural similarity", IEEE transactions on image processing, Apr. 2004, vol. 13, No. 4, pp. 600-612.
International Preliminary Report on Patentability for International Application PCT/US2019/028522, Report dated Oct. 20, 2020, dated Oct. 29, 2020, 6 Pgs.
Reda, "Synthesis and optical properties of CdS quantum dots embedded in silica matrix thin films and their applications as luminescent solar concentrators", Acta Materialia, 56, 2008, pp. 259-264, doi:10.1016/j.actamat.2007.09.017.

* cited by examiner

EPITAXY-FREE NANOWIRE CELL PROCESS FOR THE MANUFACTURE OF PHOTOVOLTAICS

CROSS-REFERENCE TO RELATED APPLICATIONS

The present application claims priority to U.S. Provisional Application No. 62/652,774, filed Apr. 4, 2018, the disclosure of which is incorporated herein by reference in its entirety.

STATEMENT REGARDING FEDERALLY SPONSORED RESEARCH

This invention was made with government support under Grant No. EEC1041895 awarded by the National Science Foundation. The government has certain rights in the invention.

FIELD OF THE INVENTION

The present invention relates to epitaxy-free processes for the manufacture of photovoltaics, and more particularly to an epitaxy-free nanowire cell processes therefore, and to photovoltaics made therefrom.

BACKGROUND OF THE INVENTION

Solar cells, or photovoltaic cells, are electrical devices that convert light energy into electricity by the photovoltaic effect. The operation of a photovoltaic (PV) cell requires three basic attributes: the absorption of light, generating either electron-hole pairs or excitons, the separation of charge carriers of opposite types, and the separate extraction of those carriers to an external circuit. Solar cells can be made of a single layer of light-absorbing material (single-junction) or use multiple configurations (multi-junctions) to take advantage of various absorption and charge separation mechanisms.

Solar cells may be made from a multitude of semiconducting materials and can be classified into first, second and third generation cells. The first generation cells—also called conventional, traditional or wafer-based cells—are typically made of a form of crystalline silicon, the commercially predominant PV technology. Second generation cells utilize thin film solar cells, that include amorphous silicon, CdTe and CIGS cells and are often used in utility-scale photovoltaic power stations. The third generation of solar cells includes a number of emerging thin-film technologies and non-traditional semiconducting materials.

The semiconductor material Gallium arsenide (GaAs) is an emerging material for the manufacture of single-crystalline thin film solar cells. Cells made from GaAs currently hold the world's record in efficiency for a single-junction solar cell at 28.8%, and have been used successfully in the formation of multijunction photovoltaic cells for concentrated photovoltaics (CPV, HCPV) and for solar panels on spacecraft. Studies have given several reasons for why GaAs has such high power conversion efficiency. First, GaAs bandgap is 1.43 ev, which is almost ideal for solar cells. The relatively wide bandgap also makes GaAs relatively insensitive to heat and thus can keep high efficiency when the operating temperature of the cell is quite high. Third, GaAs provides a great deal of flexibility to engineers in layer design allowing for the better generation of electrons and holes.

Although GaAs cells show impressive efficiency, due to the substantial capital and materials cost of the substrate and epitaxial growth processes used during manufacture they are currently considered economically nonviable. Accordingly, the economic scalability of these high efficiency solar cells is limited. Improved manufacturing processes are therefore needed to allow for the wide-spread adoption of these advanced PV technologies.

SUMMARY OF THE DISCLOSURE

Many embodiments of the present disclosure relate epitaxy-free processes for the manufacture of photovoltaics, and more particularly to an epitaxy-free nanowire cell processes therefor, and to photovoltaics made therefrom.

Many embodiments are directed to methods of forming solar cells including:
 providing a wafer substrate of a III-V semiconductor;
 disposing on a first surface of said wafer substrate a mask material configured to form an array of exposed wafer portions on said first surface;
 partially etching the wafer substrate such that an array of elongated nanostructures are formed in the wafer substrate corresponding to the exposed wafer portions, the elongated nanostructures having a base end disposed adjacent the remaining unetched wafer substrate and a tip end distal thereto;
 at least encompassing the base ends of the elongated nanostructures of the array within a polymeric layer;
 applying a lift-off force to said polymeric layer to remove the polymeric layer from the wafer substrate and sheer the elongated nanostructures encompassed with said polymeric layer from the wafer substrate such that the array of elongated nanostructures is removed from the wafer substrate to expose a new outer face thereof, and wherein the removed elongated nanostructures are disposed in a configuration such that the base ends of the elongated nanostructures are disposed at an outer surface of the polymeric layer;
 depositing a carrier selective contact on the surface formed from the base ends of the elongated nanostructures and the polymeric layer;
 depositing a conductive layer on a face of the carrier selective contact opposite the elongated nanostructure array;
 removing the polymeric layer from among the nanostructure array;
 depositing a complementary carrier selective contact on the elongated bodies and tip ends of the elongated nanostructures of the array; and
 depositing a transparent conductive oxide layer on the complementary carrier selective contact.

In still many embodiments, the method further includes repeating the steps of disposing, etching and encompassing on the wafer substrate to form a plurality of elongated nanostructure arrays therefrom.

In yet many embodiments, the method further includes passivating the wafer substrate using a process selected from the group consisting of: annealing the wafer substrate in an atmosphere of silane and ammonia, depositing a thin film of amorphous silicon atop the first surface of the wafer substrate, treating the first surface of the wafer substrate in a solution of ammonium sulfide and elemental sulfur; and forming a self-assembled monolayer of unfunctionalized or functionalized alkanethiols on the first surface of the wafer substrate.

In still yet many embodiments, the step of passivating is conducted at least prior to deposition of the carrier selective and complementary carrier selective contacts.

In still yet many embodiments, the passivation and deposition of the complementary carrier selective contact occur prior to the removal of the nanostructure array from the wafer substrate.

In still yet many embodiments, the etching of the elongated nanostructures comprises a technique selected from the group of: metal assisted chemical etching and anisotropic wet etching.

In still yet many embodiments, the III-V semiconducting material is selected from the group of: GaAs and InP.

In still yet many embodiments, the mask material is formed of a corrosion resistant metal selected from the group of: gold, silver and platinum; or a photoresist selected from the group of: silicon oxide and silicon nitride.

In still yet many embodiments, the etch is performed using a combination of an oxidizer selected from the group of: potassium nitrate, hydrogen peroxide, halogens, potassium dichromate, and potassium permanganate; and a corrosive selected from the group of: ammonia, sulfuric acid, hydrochloric acid, nitric acid, phosphoric acid, and citric acid.

In still yet many embodiments, the etch material may further comprise an additive selected from the group of: thiols and selenides.

In still yet many embodiments, the polymeric layer is formed from a material selected from the group of: PDMS, PMMA and polyimide.

In still yet many embodiments, the carrier selective and complementary carrier selective contacts are formed using a technique selected from the group of: spin coating, PECVD, evaporation, atomic layer deposition and sputtering.

In still yet many embodiments, the carrier selective and complementary carrier selective contacts are separately one of either an electron selective contact or a hole selective contact.

In still yet many embodiments, the carrier selective and complementary carrier selective contacts are separately formed from a material selected from the group of: $TiO_2$, $WO_3$, $SnO2$, phosphorous doped amorphous silicon, ZnTe, CuI, CuSCN, NiO, and boron doped amorphous silicon.

In still yet many embodiments, the conductive handle is formed from a metal selected from the group of: copper, gold and silver.

In still yet many embodiments, the transparent conductive oxide is ITO.

In still yet many embodiments, the elongated nanostructures are formed having a nanostructure height of from 0.5 to 5 μm, a distance between nanostructures of from 100 nm to 1 μm, a tip width of from 10 to 100 nm, and a base width of from 100 to 800 nm.

In still yet many embodiments, the elongated nanostructures are formed having a nanostructure height of about 1.5 μm, a distance between nanostructures of about 600 nm, a tip width of about 50 nm, and a base width of about 350 nm.

In still yet many embodiments, the III-V semiconducting material is GaAs, the carrier selective contact is formed of ZnTe and the complementary selective contact is formed of $TiO_2$.

Many embodiments are directed to methods of forming a solar cell including:
  providing a wafer substrate of a III-V semiconductor;
  disposing on a first surface of said wafer substrate a mask material configured to form an array of exposed wafer portions on said first surface;
  partially etching the wafer substrate such that an array of elongated nanostructures are formed in the wafer substrate corresponding to the exposed wafer portions, the elongated nanostructures having a base end disposed adjacent the remaining unetched wafer substrate and a tip end distal thereto;
  depositing a carrier selective contact on the array of elongated nanostructures;
  depositing a conductive layer on the carrier selective contact opposite the elongated nanostructure array;
  depositing a polymeric layer on the conductive layer;
  applying a lift-off force to said polymeric layer to remove the polymeric layer from the wafer substrate and sheer the elongated nanostructures encompassed with said polymeric layer from the wafer substrate such that the array of elongated nanostructures having the carrier selective contact and conductive layer disposed thereon is removed from the wafer substrate to expose a new outer face thereof, and wherein the removed elongated nanostructures are disposed in a configuration such that the base ends of the elongated nanostructures and at least a portion of the carrier selective contact are disposed along a single outer surface;
  depositing a complementary carrier selective contact on the single outer surface comprising the base ends of the elongated nanostructures and the carrier selective contact; and
  depositing a transparent conductive oxide layer on the complementary carrier selective contact.

Many embodiments are also directed to solar cells including:
  an array of elongated III-V semiconductor nanostructures, the elongated nanostructures having a base end and a tip end distal thereto;
  a carrier selective contact disposed adjacent the base ends of the elongated nanostructures;
  a conductive layer disposed on a face of the carrier selective contact layer opposite the elongated nanostructure array;
  a complementary carrier selective contact disposed on the elongated bodies and tip ends of the elongated nanostructures of the array; and
  a transparent conductive oxide layer disposed on the complementary carrier selective contact;
  wherein the elongated nanostructures are formed having a nanostructure height of from 0.5 to 5 μm, a distance between nanostructures of from 100 nm to 1 μm, a tip width of from 10 to 100 nm, and a base width of from 100 to 800 nm.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which forms a part of this disclosure.

SUMMARY OF THE FIGURES

The summary of the invention will be more fully understood with reference to the included figures. The included figures represent exemplary embodiments of the invention and should construed as a complete recitation of the scope of the invention, wherein.

DETAILED DISCLOSURE

Turning to the data and figures, embodiments of photovoltaics configured to be manufactured without epitaxial processes and methods for such manufacture are provided. Many embodiments utilize bulk semiconducting crystal substrates, such as, for example, GaAs and InP such that epitaxy processes are not required. Various embodiments use nanowire etch and exfoliation such that processes allow the manufacture of large numbers of photovoltaic cells per substrate wafer (e.g., greater than 100). Embodiments of photovoltaic cells incorporate electron and hole selective contacts such that epitaxial heterojunctions are avoided during manufacture. Various embodiments also avoid vacuum processing such that manufacturing costs are reduced.

As the uptake of renewable energy increases, demand for less-expensive photovoltaics (PVs) also continues to increase. While III-V-based PV cells are highly efficient, making them prime targets for terrestrial PV applications, the high semiconductor growth and substrate costs make fabrication roughly 100-fold more expensive than conventional Si cells, limiting the commercial applications of these devices to higher cost multi-junction and space applications.

Specifically, heteroepitaxy of III-Vs on Si, which is high quality and low cost, is difficult due to lattice parameter and thermal expansion coefficient mismatch as well as antiphase boundaries that form during polar III-V growth on the non-polar Si. In addition, commercial production of these devices typically uses metal-organic vapor phase epitaxy (MOVPE), utilizing metal-organic molecules (e.g. trimethylgallium) as group III precursors, typically hydrides (e.g. phosphine and arsine) as group V precursors, and a range of similar precursors for dopants. However, MOVPE semiconductor growth costs are high both because of the precursors used and the slow growth rates. The lower growth rate also limits scalability, and the need for high-vacuum growth environments further raises cost.

The current disclosure is directed to type III-V PV cells (e.g., GaAs or InP) and methods of their manufacture with low capital and material cost. Various embodiments accomplish this by allowing for the production of a large number of solar cells from one wafer without the need for epitaxial growth techniques.

Embodiments Implementing Solar Cells

Figure 1:
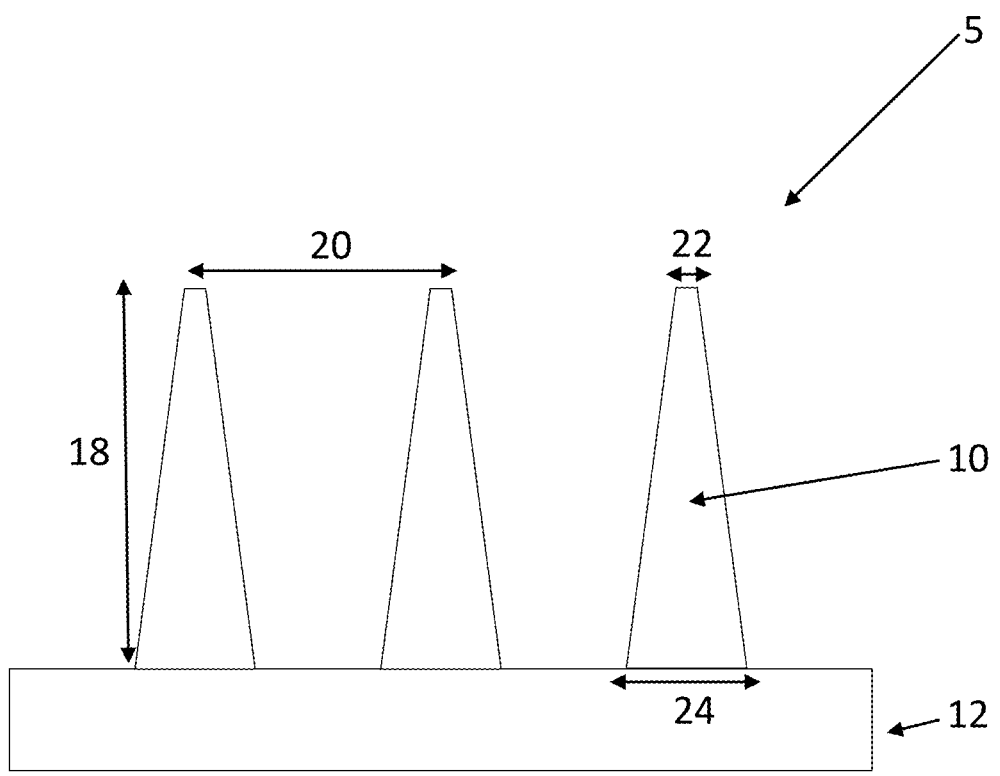
FIG. 1 illustrates a nanostructure-incorporating solar cell structure in accordance with embodiments.
Figure 2:
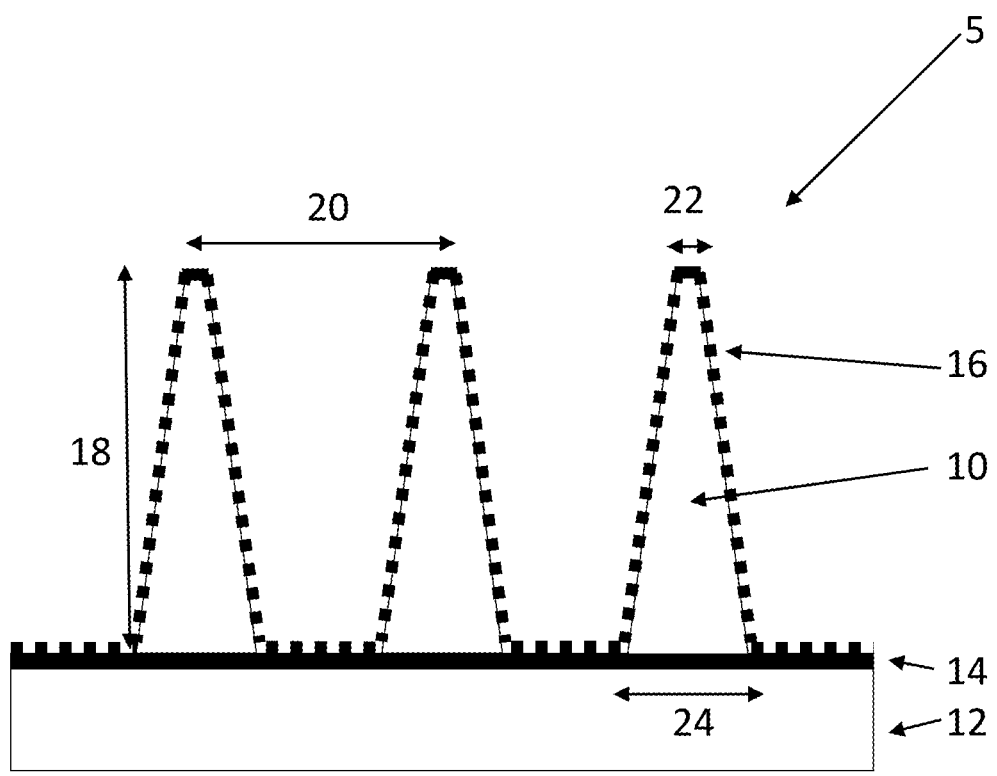
FIG. 2 illustrates a nanostructure-incorporating heterojunction solar cell structure in accordance with embodiments.

Many embodiments implement a III-V nanostructure solar cell (5) comprising a photoabsorber formed of a plurality of nanowires or triangular cross-section nanofins (10) disposed atop a conductive reflector substrate (12), as shown schematically in FIG. 1. Still other embodiments implement a III-V nanostructure solar cell (5) comprising a photoabsorber formed of a plurality of nanowires or triangular cross-section nanofins (10) disposed atop a conductive reflector substrate (12) and having additional layers for passivation and with non-epitaxial heterojunctions for efficient charge carrier extraction, as shown schematically in FIG. 2. In many such embodiments the nanowire/nanofin photoabsorber structure (10) is formed separately (as will be described in greater detail below), and disposed atop a carrier selective contact formed of a conductive reflector (12) and a suitable electron or hole selective contact material (14). The solar cell further comprises complementary carrier selective contact and transparent conductive oxide layers (16) disposed atop the plurality of nanowires/nanofins (10).

Although the nanofins/nanowire structures (10) of the photoabsorber are shown as having generally triangular cross-sections where the base cross-section is larger than the tip, it will be understood that structures of any suitable tapered geometry may be used and described in reference to four primary dimensions: structure height (18), structure density as defined by the center to center distance (20) between structures, structure sharpness defined by the width (22) at the top or distal end of the structures, structure base width (24) defined as the width of the structures at their proximal end where they attach to the substrate (12). For example, a reverse taper in which the base is narrower than the tip may also be employed. Again, although nanowire/nanofin structures (10) may be formed with any suitable dimensions, in many embodiments the structure height (18) is on the order of 0.5 to 5 µm, in many such embodiments on the order of 1 to 2 µm, and in still many such embodiments on the order of 1.5 µm; the distance (20) between the structures is on the order of 100 nm to 1 µm, in many such embodiments on the order of 200 to 800 nm, and in still many such embodiments on the order of 600 nm; the distal tip width (22) is on the order of 10 to 100 nm, in many such embodiments on the order of 25 to 75 nm, and in still many such embodiments on the order of 50 nm; and the proximal base width (24) is on the order of 100 to 800 nm, in many such embodiments on the order of 200 to 500 nm, and in still many such embodiments on the order of 350 nm.

Turning to the materials for the elements of nanostructure solar cells according to embodiments, in many embodiments the nanofin/nanowire structures (10) of the photoabsorber are formed of a suitable III-V semiconducting materials, including, for example, GaAs, InP. The carrier selective contact and complementary carrier selective contacts (14 & 16) according to embodiments may be formed of any suitable combination of materials for the specific solar cell application. In embodiments of the solar cell where the contact comprises an electron selective contact, materials comprising n-type semiconductors may be used, such as, for example, $TiO_2$, $WO_3$, $SnO_2$, Spiro-OMeTAD, PTAA, and phosphorous doped amorphous silicon, among others. In embodiments of the solar cell where the contact comprises a hole selective contact, materials comprising p-type semiconductors may be used, such as, for example, ZnTe, CuI, CuSCN, NiO, $C_{60}$, PCBM, and boron doped amorphous silicon, among others. The conductive reflector (12) may be formed of any suitable conductive materials, including, for example, Au or Cu. As described, the complementary carrier selective contact (16) according to many embodiments may further comprise a layer configured to help efficient lateral transport, such as, for example, a transparent conductive oxide, such as ITO, among others.

The thickness of each of the active layers of the solar cell (5) may also be modified as suitable. In many such embodiments the carrier selective contact (14) and complementary carrier selective contact (16) may be on the order of 10 to 50 nm, in many other embodiments on the order of 15 to 30 nm, and in still many other embodiments on the order of 20 to 25 nm. The efficient layer transport layer according to embodiments may be on the order of 20 to 75 nm, in many other embodiments on the order of 30 to 60 nm, and in still many other embodiments on the order of 45 nm.

Although the above discussion has focused on the active layers of solar cells according to embodiments, it will be understood that many embodiments of such cells also incorporate passivation layers disposed in conjunction with the III-V semiconducting materials. In many such embodiments, the passivating materials may comprise, for example, silicon oxynitride, amorphous silicon, sulfur, and functionalized alkanethiols, among others.

Embodiments Implementing Methods of Forming Solar Cells

Figure 3:
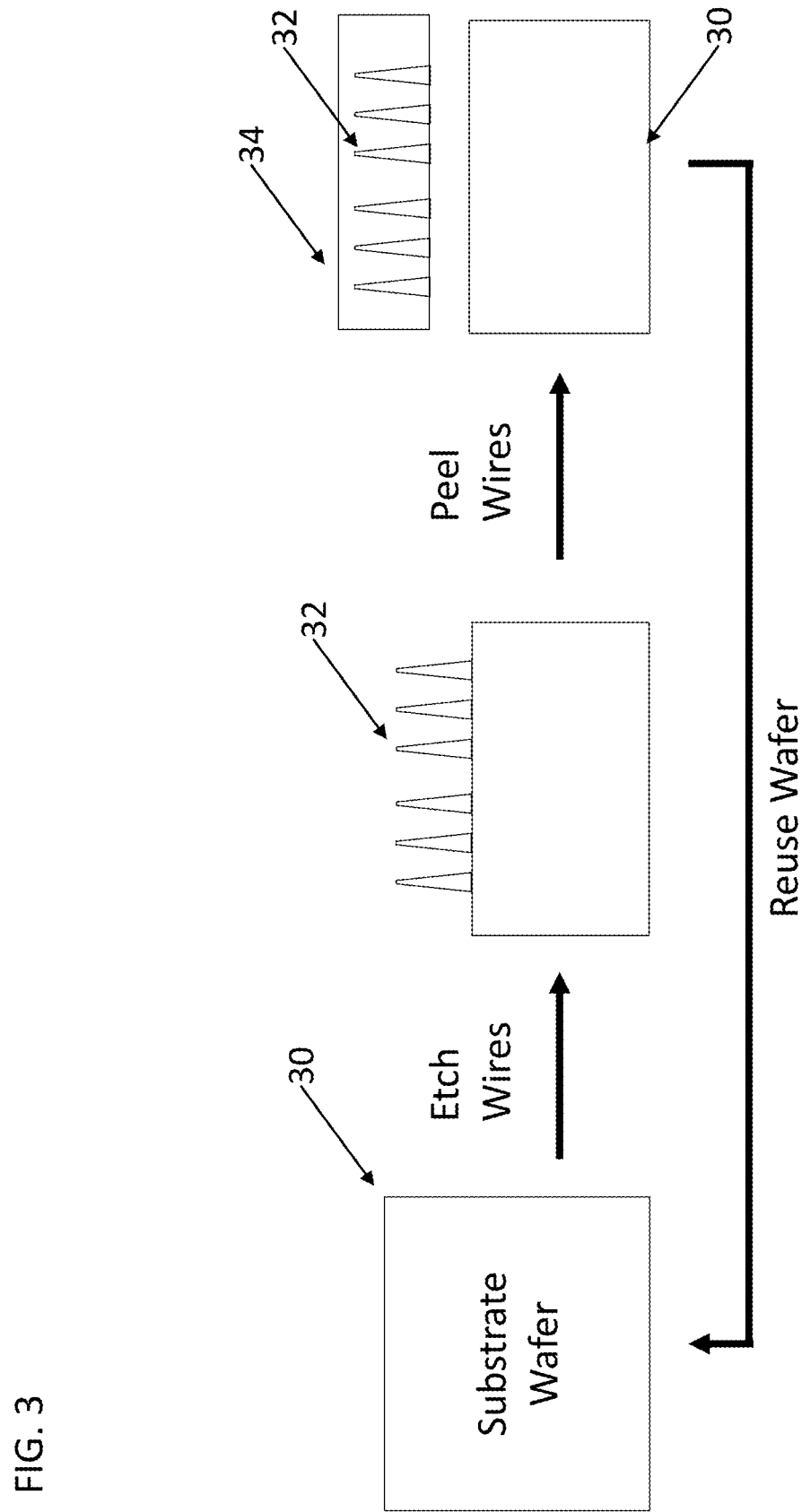
FIG. 3 illustrates a method of forming nanostructures for solar cell structures in accordance with embodiments.
Figure 4:
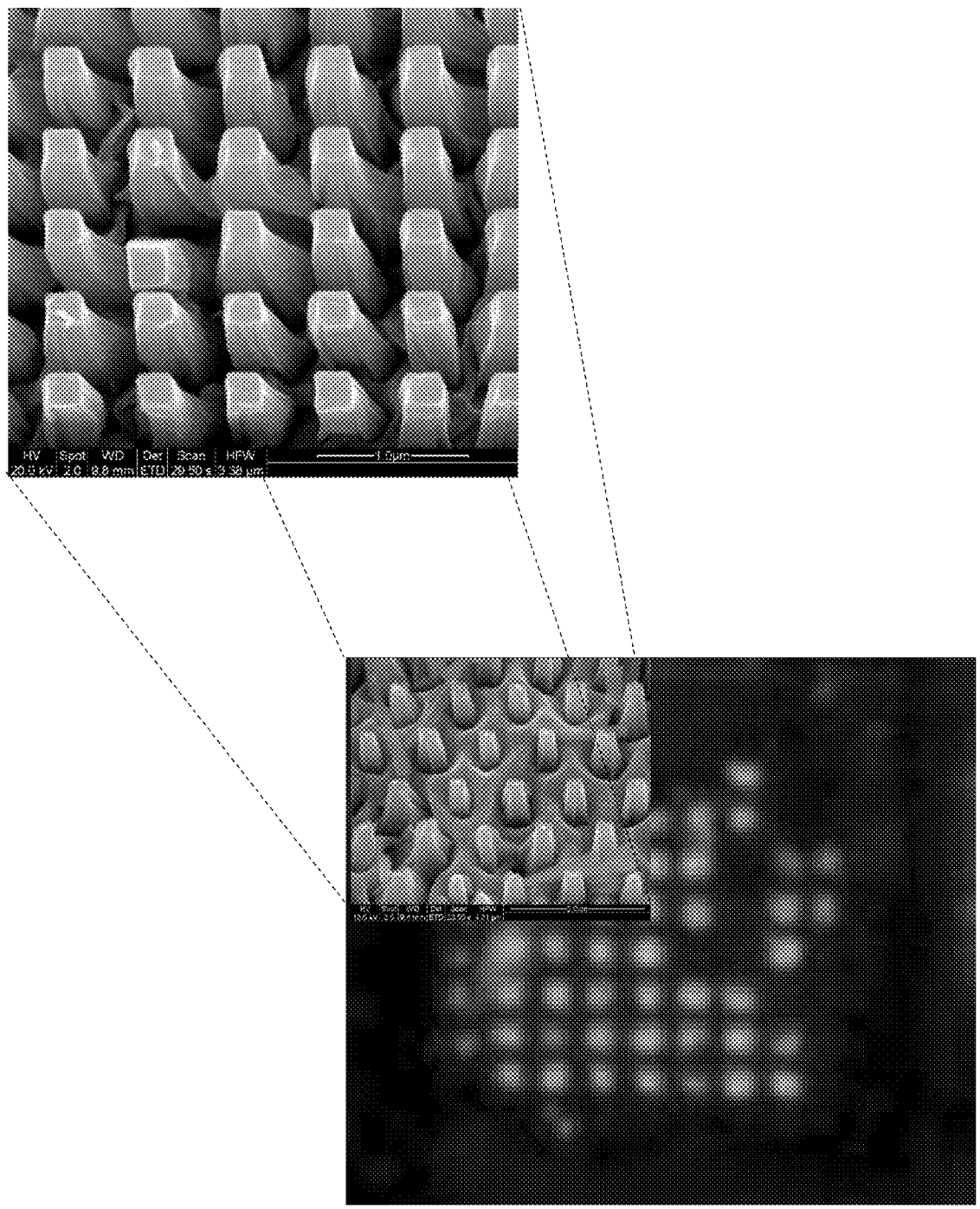
FIG. 4 provides an image of a nanostructure array formed in accordance with embodiments.

Although the above discussion has focused on embodiments of solar cells, various embodiments are also directed to methods of forming such solar cells at low cost and in high volume. In accordance with embodiments of methods for forming a plurality of arrays of nanowire/nanofin structures for solar cells from a single wafer a metal assisted chemical etching (MACE) or anisotropic wet etching process is provided to etch a nanostructure array onto a III-V wafer, as shown schematically in FIG. 3. As shown, in general terms a series of nanowire/nanofin structures (32) are etched into the surface of a wafer (30) of a III-V semiconducting material. These structures (32) are then lifted off or exfoliated from the wafer substrate (30) using a polymeric handle (34) exposing a fresh surface of the semiconducting wafer substrate into which can be etched another set of nanowire/nanofin structures such that many arrays of nanostructures may thus be formed from a single wave of semiconducting material. A micrograph showing an image of an exemplary nanostructure array according to embodiments and formed in accordance with such MACE process embodiments is provided in FIG. 4.

Figure 5A:
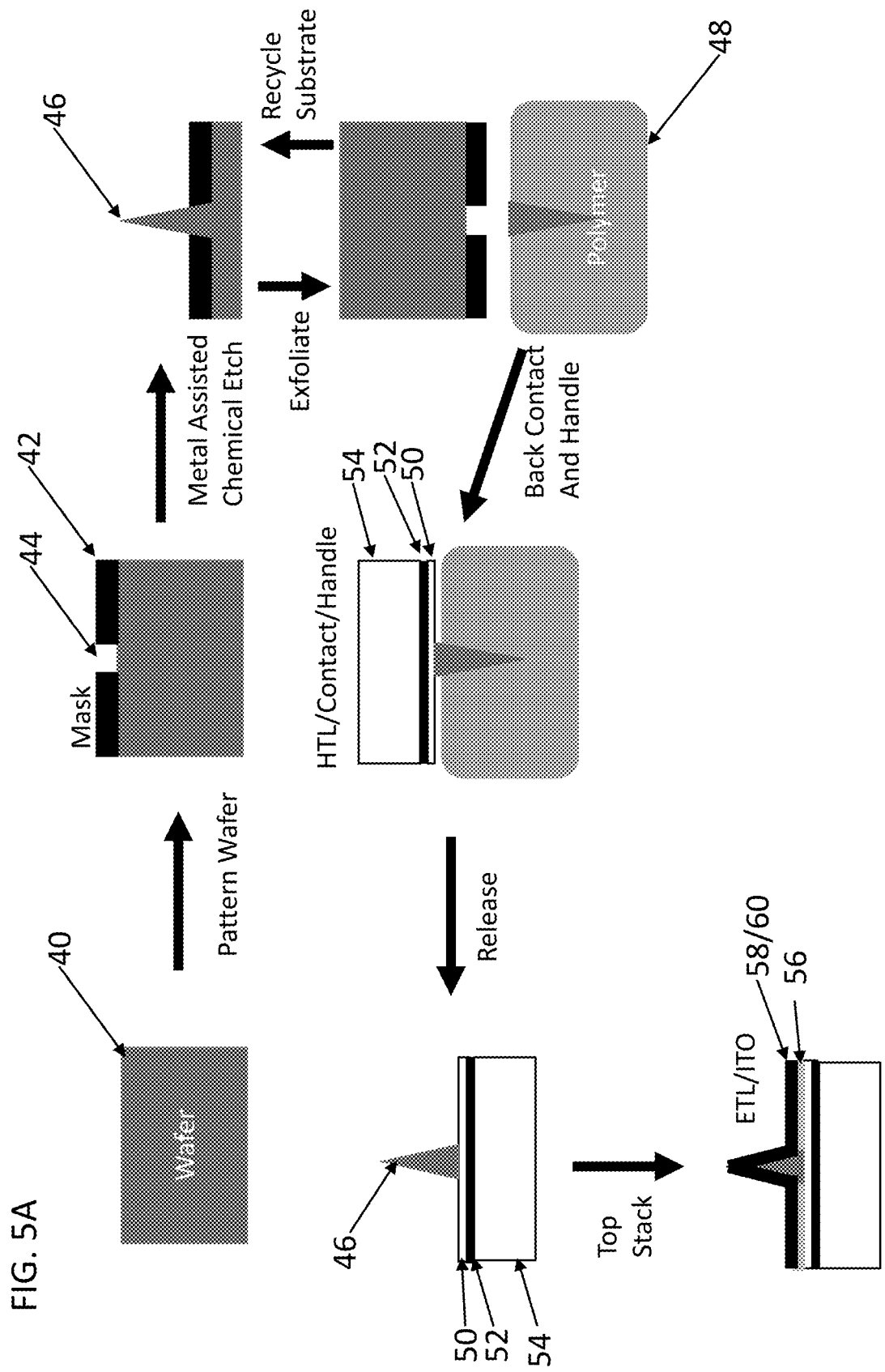
FIGS. 5A and 5B illustrate methods of forming heterojunction solar cells in accordance with embodiments.
Figure 5B:
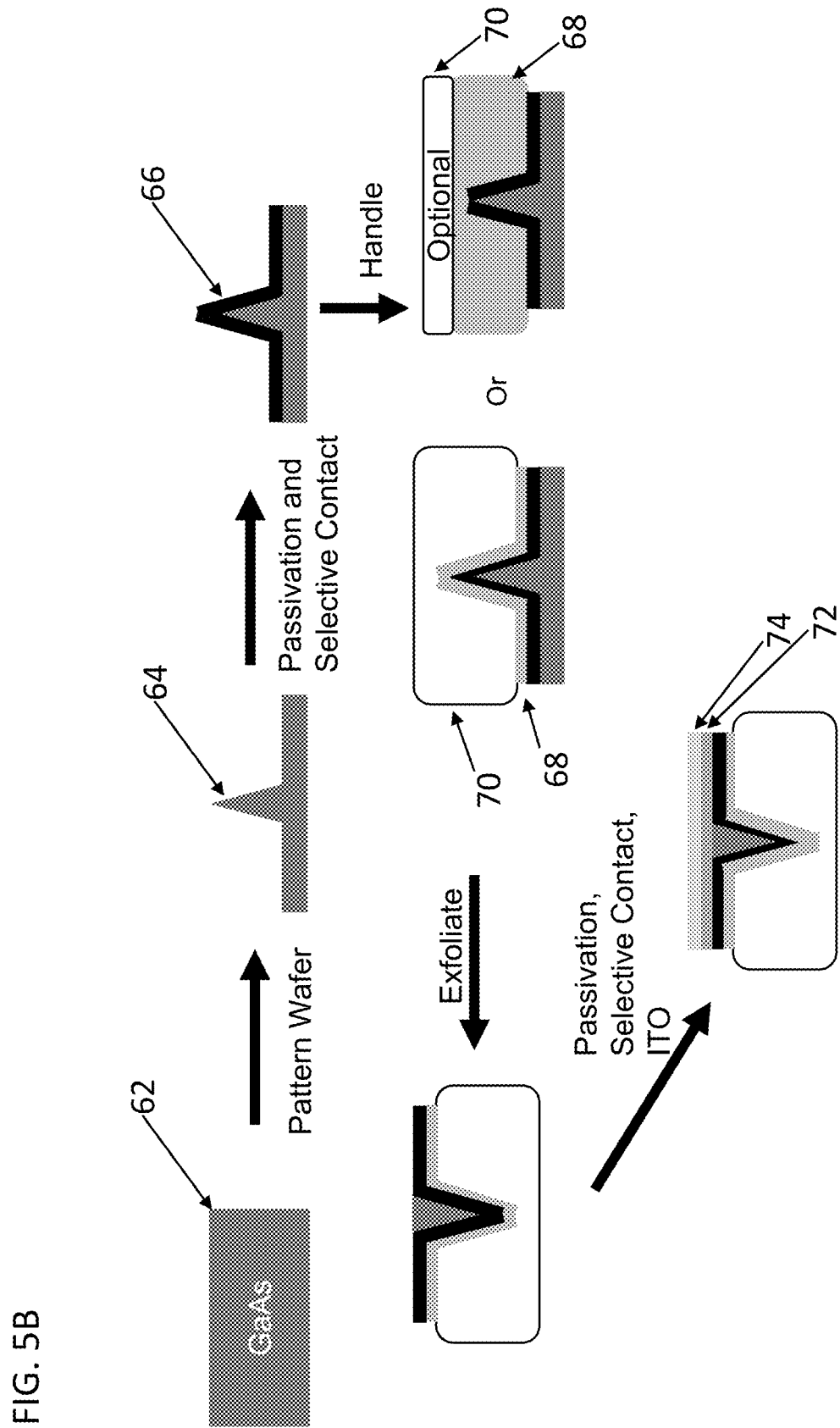

Although the above discussion has described the process for forming nanostructures in general terms, more detailed schematics according to embodiments are shown in FIGS. 5A and 5B. As shown, for embodiments incorporating MACE, a metal mask (42) is disposed on the surface of the semiconductor wafer (40). In various embodiments the mask (42) may be formed, for example, of gold, silver, platinum, or any other suitable corrosion resistant metals. In other embodiments, the mask may comprise a metal film (42) with holes (44) that define the un-etched portions of the semiconductor wafer (40). In many embodiments, the etch proceeds by dipping the wafer (40) with metal mask (42) in an oxidizing solution along with an acid or base that etches the oxidized semiconductor. In various embodiments the method uses potassium permanganate as the oxidizer, however, other oxidizers may also be used, such as, for example, potassium nitrate, hydrogen peroxide, etc. A number of suitable corrosives may be used according to embodiments to etch the oxidized semiconductor, such as, for example, hydrofluoric acid, phosphoric acid and ammonia, among others. In such embodiments, the etch proceeds until the nanowire structures (46) are of suitable dimensions, such as, for example, on the order of 1.5 um tall.

Alternatively, embodiments may utilize an anisotropic wet-chemical etching process. In such embodiments, the wafer (40) is patterned with a mask (42) such as photoresist (e.g., silicon oxide, silicon nitride, or other), and is then dipped in a corrosive oxidizing solution that etches the various crystal planes of the semiconductor at different rates. Possible choices for corrosive according to embodiments include, for example, ammonia, sulfuric acid, hydrochloric acid, nitric acid, phosphoric acid, citric acid, etc. Possible choices for oxidizers according to embodiments include, for example, hydrogen peroxide, halogens, potassium dichromate, potassium permanganate, potassium nitrate, etc. Various embodiments may also include additives that attach to specific crystal planes, such as, for example, thiols or selenides. In accordance with such embodiments, the high-aspect ratio nanostructures can be tuned by modifying the relative etching rates.

As shown in FIG. 5A, once the nanowire structures (46) are etched from the wafer (40), they are removed or exfoliated using a lift-off handle (48). In various embodiments, the handle is formed from a polymer, such as, for example, PDMS, PMMA, polyimide, etc. In many embodiments, a 110 orientation wafer (40) may be used as the substrate as it encourages the nanostructures (46) to fracture at their bases, easing exfoliation from the substrate. Once the nanostructures (46) have been removed, the wafer may be reused for producing additional nanostructure arrays. In various embodiments, the wafer may be further processed prior to forming additional nanostructures, such as, for example, by an intermediate chemical or chemomechanical cleaning and polishing step.

In many embodiments, prior to formation or after formation and exfoliation of the nanostructures, the surface of the semiconductor wafer (40) is passivated (50). A number of passivation techniques, either singly or in combination, may be used in accordance with embodiments. In some embodiments the wafer is annealed in a high-purity atmosphere of silane and ammonia which reduces surface oxides and produces a thin film of silicon oxynitride. In various embodiments PECVD is used to deposit a thin film of amorphous silicon, again reducing the presence of surface oxides. In many embodiments the wafer surface is treated with a solution of ammonium sulfide and about 5% elemental sulfur added by weight. Such a process etches the wafer surface leaving it terminated with an electrically benign sulfur layer. In several embodiments a self-assembled monolayer (SAM) of unfunctionalized or functionalized alkanethiols is formed on the surface by dipping the wafer in a solution of the alkanethiol (such as 1-octanethiol or 8-mercapto-1-octanol) along with typically isopropanol as a diluent, ammonia to etch the semiconductors native oxide, and dithiothreitol to prevent oxidation of the chemicals. Although certain exemplary embodiments are described, considerable variability is possible concerning the choice of specific chemicals and quantities thereof.

In various embodiments, after backside passivation (50), the carrier selective contact (52) is formed by depositing, for electron selective contacts, n-type semiconductors including $TiO_2$, $WO_3$, $SnO_2$, and phosphorous doped amorphous silicon, and for hole selective contacts, p-type semiconductors including ZnTe, CuI, CuSCN, NiO, and boron doped amorphous silicon. In many embodiments, the contacts can either be deposited through solution techniques such as spin coating or vacuum techniques such as PECVD, evaporation, atomic layer deposition, sputtering, etc. In several embodiments, a conductive handle (54), such as electroplated copper, is then applied to the back of the nanostructures (46). The front handle material (48) is then removed. The front is then passivated (56), as described above, and the complementary carrier selective contact (58) is then applied in an analogous manner, followed by a transparent conductive oxide such as indium tin oxide for efficient lateral charge transport (60).

Although one exemplary arrangement of process steps is described above, it should be understood that the surface passivation, heterojunction deposition, and metallization (including transparent conductors and metal grid contacts) steps may be performed prior to exfoliation. In such embodiments, the half-finished cell would then be exfoliated, the back passivated, contacted, and metallized to finish the manufacturing process for the cell.

In some embodiments, as shown in FIG. 5B, the semiconductor material may be disposed in the opposite direction. As shown in these embodiments the wafer semiconductor wafer (62) is patterned and a plurality of nanostructures (64) formed thereon, as previously described. The semiconducting nanostructures are then passivated, as previously described, and a first selective carrier contact (66) formed thereon. The first selective carrier contact (66) is then covered in a conductive metal layer (68). This conductive metal layer may then be attached with a polymer handle (70) and removed/exfoliated. Finally, the second side of the semiconducting nanostructure layer is passivated and a second selective carrier contact (72) and a transparent oxide layer (74) applied thereon.

Exemplary Embodiments

As will be discussed in greater detail in the following Exemplary Embodiments section, the disclosure is directed to improved III-V solar cells and methods of their manufacture. Exemplary embodiments of the disclosure display many advantages such as remarkable efficiency in combination with a low cost manufacturing process. Although the following sections provide specific solar cell constructions in accordance with embodiments of methods in the disclosure and data demonstrating the properties of such solar cells, it will be understood that these example are being provide for illustration purposes and are not mean to be taken as limiting the scope of the disclosure.

Exemplary Embodiment 1: Solar Cell Efficiency

Figure 6A:
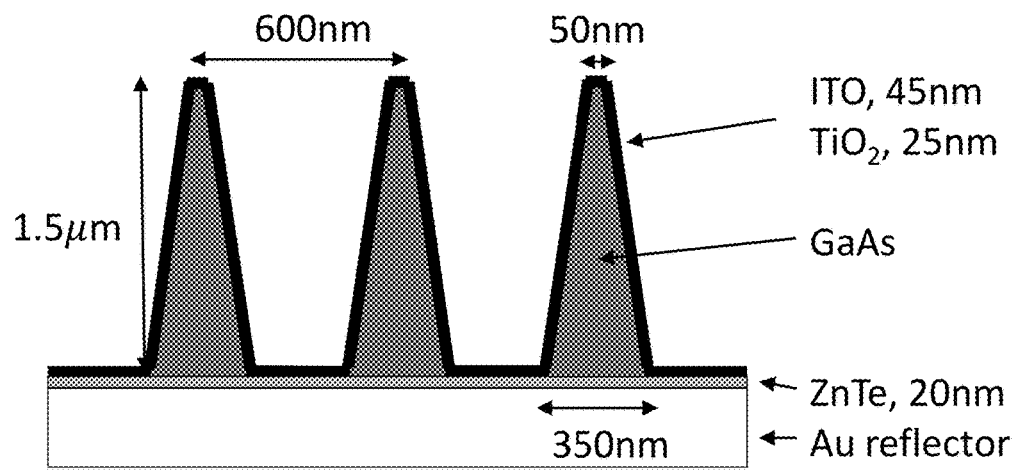
FIG. 6A illustrates a nanostructure-incorporating heterojunction solar cell structure in accordance with embodiments.
Figure 6B:
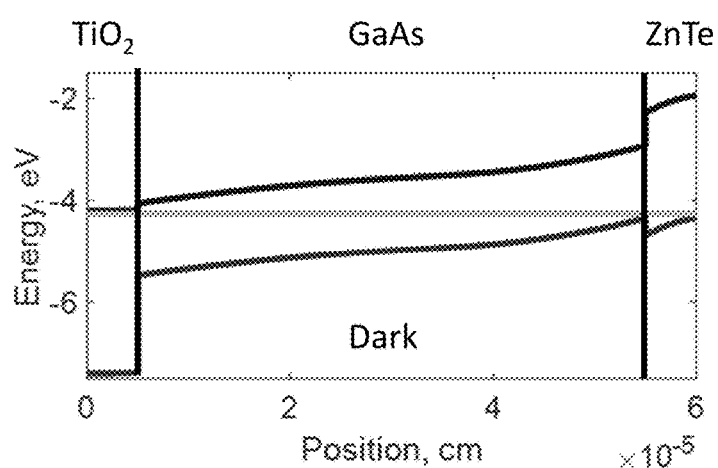
FIGS. 6B and 6C provide data plots of band gaps for nanostructure-incorporating heterojunction solar cells, as shown in FIG. 6B, in accordance with embodiments.
Figure 6C:
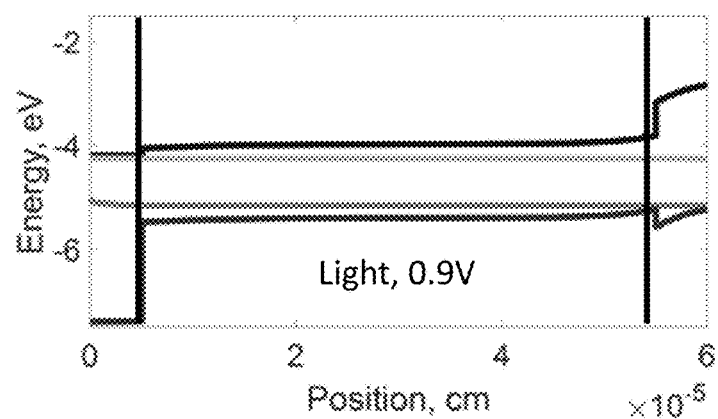

To test the efficiency of solar cells formed in accordance with embodiments, a GaAs heterojunction solar cell, as shown schematically in FIG. 6A, was formed in accordance with process embodiments previously described. As shown, the solar cell is formed of a plurality of GaAs nanowire/nanofin structures (10) having a height of ~1.5 µm, a base width of ~350 nm, a tip width of ~50 nm, and a center-to-center distance of ~600 nm. The proximal or base end of the nanostructures are disposed in association with a carrier selective conductor formed of a ~20 nm ZnTe semiconducting material layer formed atop gold reflector conductive handle. The distal or outer surface of the nanostructures is in turn coated with a complementary carrier selective contact formed from an inner ~25 nm $TiO_2$ layer and an outer ~45 nm ITO layer. The dimensions and materials used in the construction of the exemplary solar cell are shown schematically in FIG. 6A. Studies simulate two defects: an EL2 midgap bulk defect in the GaAs wafers, and uniform 5e11 $cm^{-2}eV^{-1}$ defect concentrations at the heterojunction interfaces. Band diagrams for the GaAs heterojunctions are provided in dark and illuminated conditions in FIGS. 6B and 6C, respectively. As shown, the bulk semi-insulating GaAs is depleted and resistive when not illuminated, and the heterojunctions highly conductive under illumination. The cells have the following figures of merit:

- A short-circuit current density ($J_{sc}$), i.e., the current through the solar cell when the voltage across the solar cell is zero (i.e., when the solar cell is short circuited) of 30.6 $mAcm^{-2}$.
- An open-circuit voltage ($V_{OC}$), i.e., the maximum voltage available from the solar cell of 1.08 V.
- A fill factor (FF), i.e., the ratio of the maximum power from the solar cell to the product of $V_{OC}$ and the short-circuit current ($I_{sc}$) of 81%.
- A solar cell efficiency (η), i.e., the ratio of the output electrical power at the maximum power point on the IV curve divided by the incident light power according to:

$$\eta = \frac{V_{OC} I_{SC} FF}{P_{inc}} \text{ of } 26.8\%.$$

As will be evident, these tests demonstrate the high efficiency of the GaAs heterojunction solar cells formed in accordance with embodiments.

Exemplary Embodiment 2: Material Absorption Efficiency

Figure 7A:
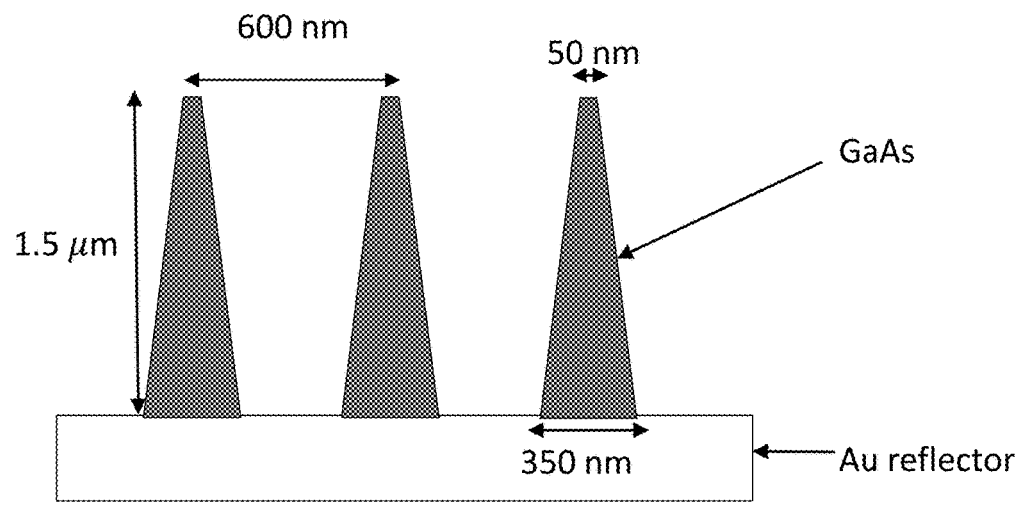
FIG. 7A illustrates a nanostructure-incorporating solar cell structure in accordance with embodiments.
Figure 7B:
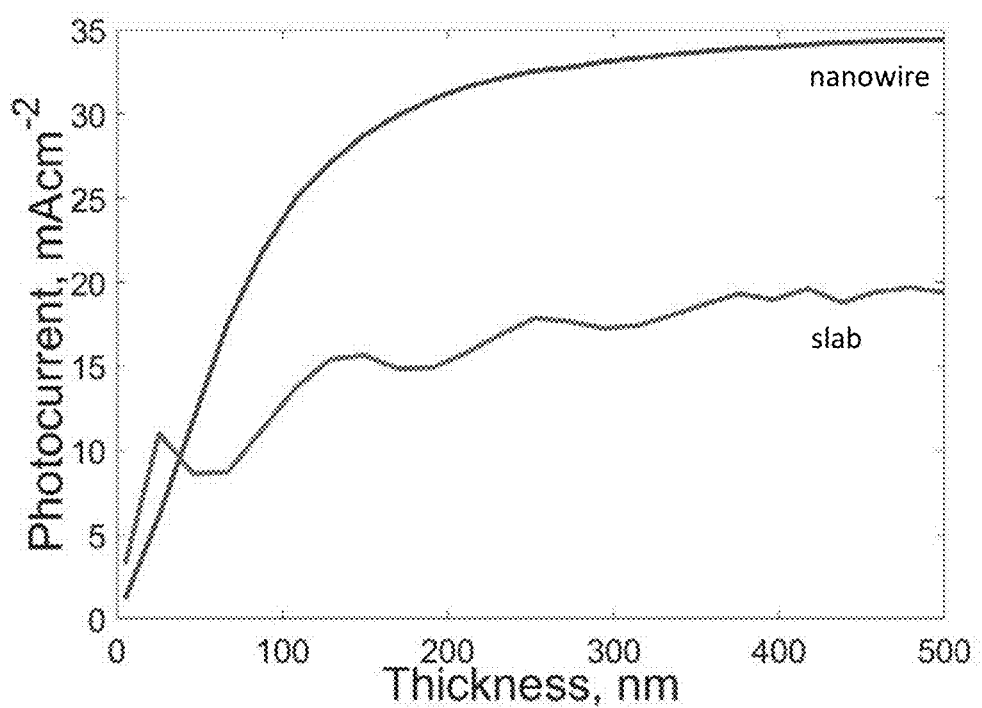
FIG. 7B provides a data plot of photocurrent absorption against material thickness for nanostructure-incorporating heterojunction solar cells in accordance with embodiments.

To demonstrate the material efficiency of the heterojunction solar cells formed in accordance with embodiments, a GaAs heterojunction solar cell, as shown schematically in FIG. 7A, was formed in accordance with process embodiments previously described. As shown, the solar cell is formed of a plurality of GaAs nanowire/nanofin structures (10) having a height of ~1.5 µm, a base width of ~350 nm, a tip width of ~50 nm, and a center-to-center distance of ~600 nm. The proximal or base end of the nanostructures are disposed in association with gold reflector conductive handle. The dimensions and materials used in the construction of the exemplary solar cell are shown schematically in FIG. 7A. Results of a study of photocurrent absorption by the exemplary nanostructure solar cells and conventional slab-type solar cells plotted as a function of the thickness of the semiconductor photoabsorber material is provided in FIG. 7B. As shown, not only do solar cells incorporating nanostructures according to embodiments show improve photocurrent absorption in comparison to conventional structures, but they further need far less semiconducting material to achieve the same absorption characteristics. Specifically, nanostructure containing solar cells according to embodiments need only 200 nm of planar equivalent material to achieve efficient absorption.

Exemplary Embodiment 3: Heterojunction Testing

Figure 8A:
FIG. 8A illustrates a nanostructure-incorporating solar cell structure in accordance with embodiments.

To demonstrate the properties of heterojunction solar cells incorporating nanostructures in accordance with embodiments, exemplary cells formed with heterojunctions as shown schematically in FIG. 8A were formed. As shown, these solar cells incorporate a heterojunction comprising a III-V semiconductor photoabsorber disposed atop an Ohmic contact at one end and a heterojunction at the other, wherein the heterojunction comprises a series of active and passivating layers atop the III-V semiconductor. In various embodiments such layers include a metal or ITO outer layer, and a selective contact disposed adjacent said outer layer to efficiently collect minority carriers (e.g., as motivated by perovskite and OPV technologies). In addition, passivating layers may also be incorporated into the structure, including, for example, an amorphous silicon layer to reduce any native oxide on the III-V semiconducting material, and a protective layer disposed between the amorphous silicon layer and the carrier selective contact to protect the carrier selective contact from the reactive silicon material. In many such embodiments, the protective layer comprises a thin $Al_2O_3$. Although specific thickness are shown in relation to several of the layers, in many embodiments the thickness may take any suitable size such that the layers remain sufficiently thin to tunnel through.

Figure 8B:
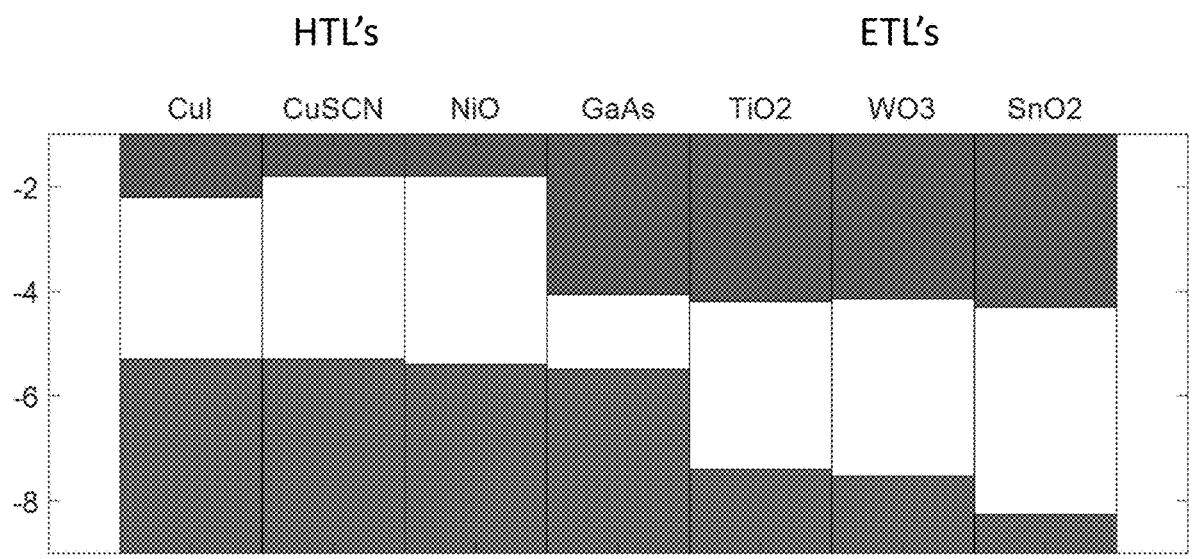
FIG. 8B illustrates a diagram of band alignments for various carrier selective contact materials in accordance with embodiments.

Turning to possible materials for the carrier selective contact the carrier selective contact may comprise materials useful as either hole transport layers (HTLs) or electron transport layers (ETLs), as desired by the application. FIG. 8B provides a summary of some of the possible carrier selective contact materials usable in embodiments of the solar cells. As shown, exemplary materials include, for example, HTLs, such as, CuI, CuSCN and NiO, and ETLs, such as, GaAs, $TiO_2$, $WO_3$, and $SnO_2$.

Figure 9A:
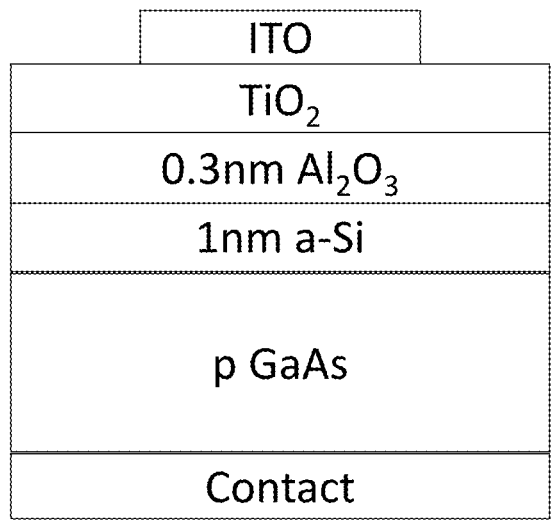
FIG. 9A illustrates a nanostructure-incorporating heterojunction solar cell structure having an electron transport layer in accordance with embodiments.
Figure 9B:
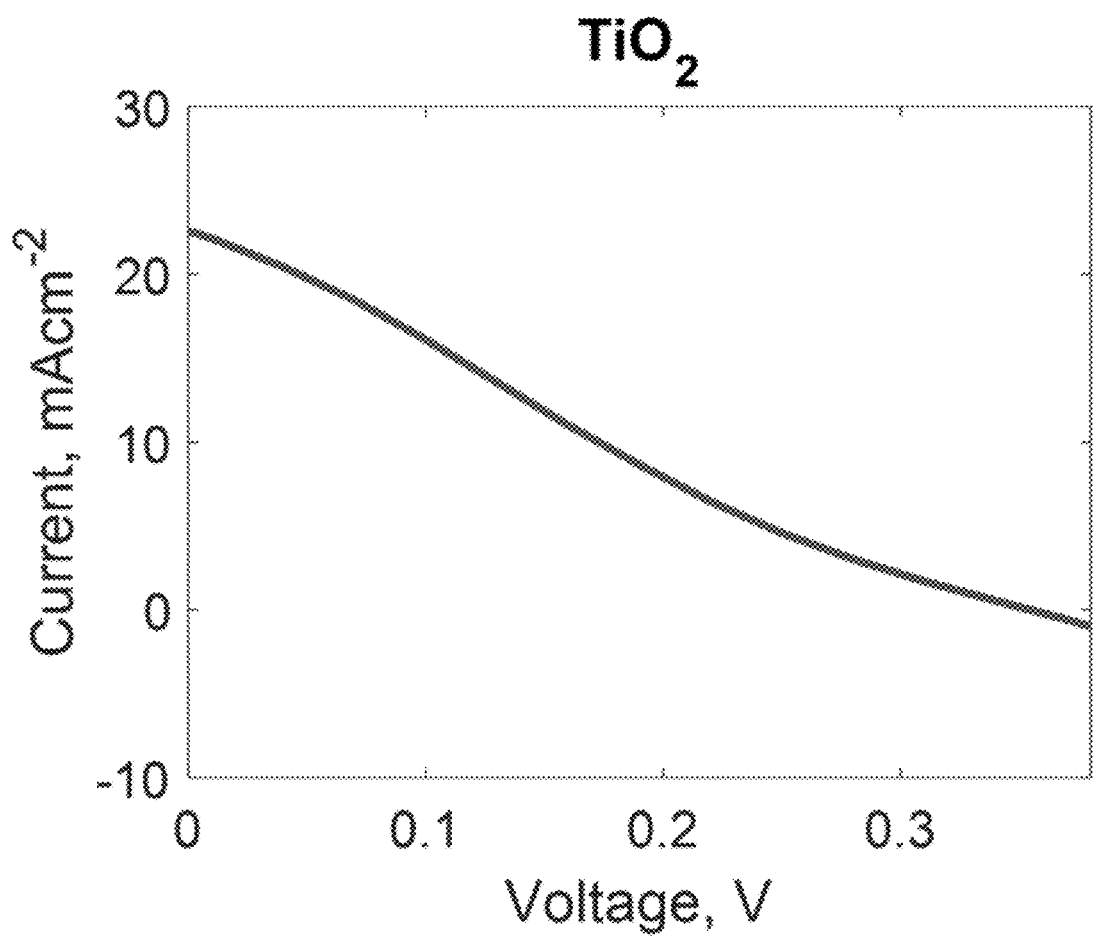
FIG. 9B illustrates a power curve for a nanostructure-incorporating heterojunction solar cell of 9A, in accordance with embodiments.
Figure 10A:
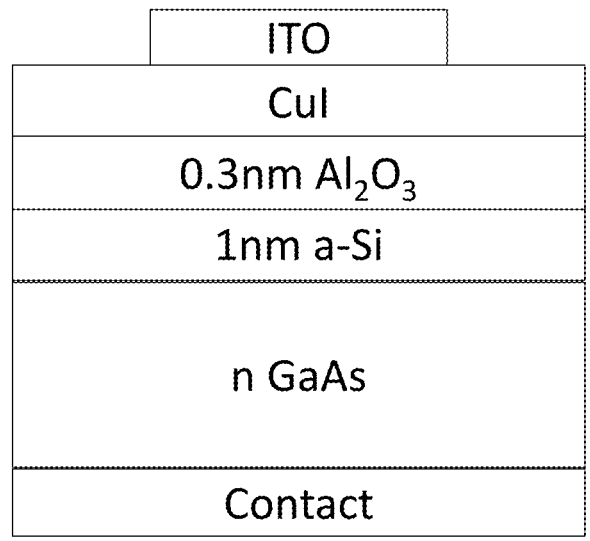
FIG. 10A illustrates a nanostructure-incorporating heterojunction solar cell structure having a hole electron transport layer in accordance with embodiments.
Figure 10B:
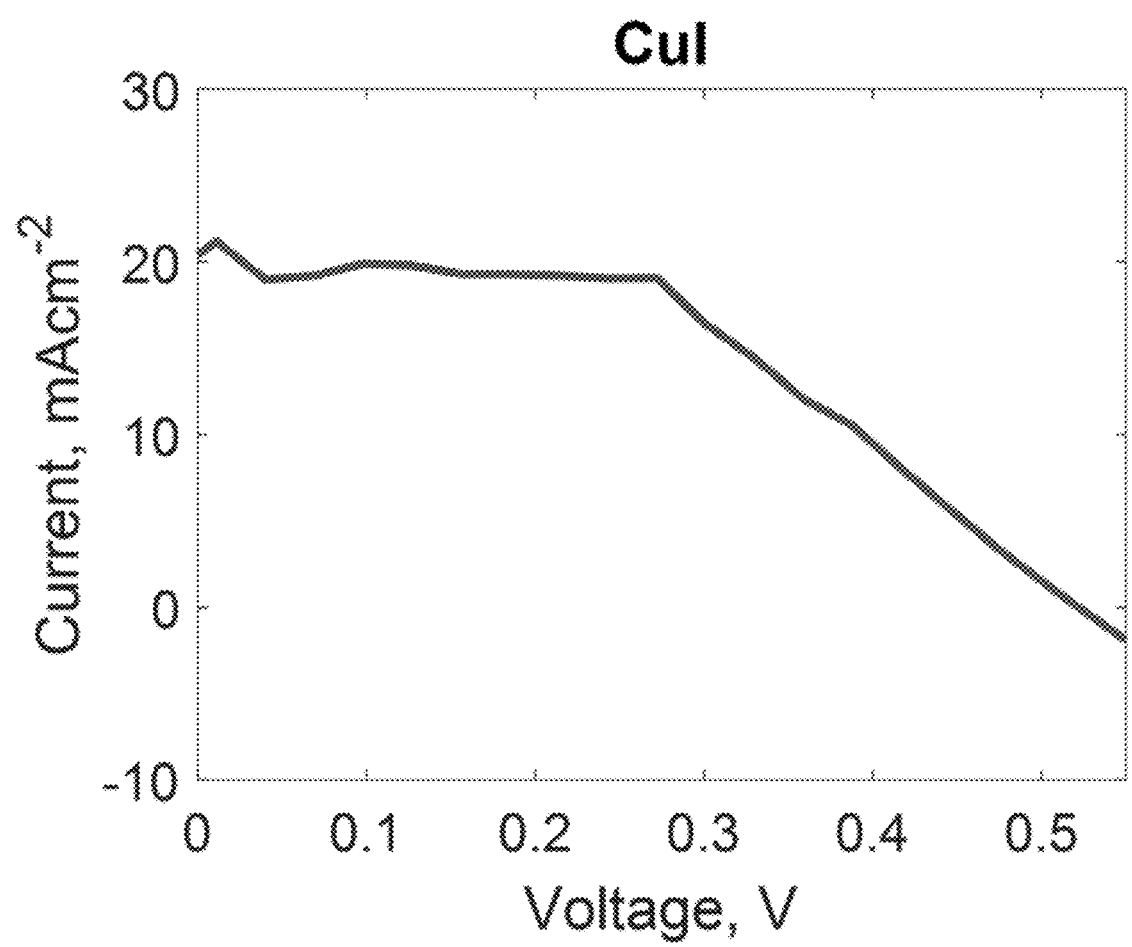
FIG. 10B illustrates a power curve for the nanostructure-incorporating heterojunction solar cell of FIG. 10A, in accordance with embodiments.

Using the nanostructure solar cell structure as described above, two exemplary solar cells, one incorporating an ETL carrier selective contact (e.g., $TiO_2$, as shown in FIG. 9A), and one incorporating an HTL carrier selective contact (e.g., CuI, as shown in FIG. 10A), were formed and tested. Power curves for both exemplary cells are provided in FIGS. 9B and 10B. As shown, the ETL containing heterojunction solar cell according to embodiments has the following figures of merit:
- A short-circuit current density ($J_{sc}$) of 22.6 mAcm$^{-2}$;
- An open-circuit voltage ($V_{OC}$) of 354 mV;
- A fill factor (FF) of 22%; and
- A solar cell efficiency ($\eta$) of 1.8%.

As shown, the HTL containing heterojunction solar cell according to embodiments has the following figures of merit:
- A short-circuit current density ($J_{sc}$) of 20.2 mAcm$^{-2}$,
- An open-circuit voltage ($V_{OC}$) of 522 mV;
- A fill factor (FF) of 49%; and
- A solar cell efficiency ($\eta$) of 5.2%.

Although the description above contains many specificities, these should not be construed as limiting the scope of the invention but as merely providing illustrations of some of the presently preferred embodiments of the invention. Various other embodiments are possible within its scope. Accordingly, the scope of the invention should be determined not by the embodiments illustrated, but by the appended claims and their equivalents.

The invention claimed is:

1. A method of forming a solar cell comprising:
   providing a wafer substrate of a III-V semiconductor;
   disposing on a first surface of said wafer substrate a mask material configured to form an array of exposed wafer portions on said first surface;
   partially etching the wafer substrate such that an array of elongated nanostructures are formed in the wafer substrate corresponding to the exposed wafer portions, the elongated nanostructures having a base end disposed adjacent the remaining unetched wafer substrate and a tip end distal thereto;
   at least encompassing the base ends of the elongated nanostructures of the array within a polymeric layer;
   applying a lift-off force to said polymeric layer to remove the polymeric layer from the wafer substrate and sheer the elongated nanostructures encompassed with said polymeric layer from the wafer substrate such that the array of elongated nanostructures is removed from the wafer substrate to expose a new outer face thereof, and wherein the removed elongated nanostructures are disposed in a configuration such that the base ends of the elongated nanostructures are disposed at an outer surface of the polymeric layer;
   forming a first passivation layer on the surface formed from the base ends of the elongated nanostructures and the polymeric layer;
   depositing a carrier selective contact on the first passivation layer;
   depositing a conductive layer on a face of the carrier selective contact opposite the elongated nanostructure array;
   removing the polymeric layer from among the elongated nanostructure array;
   forming a second passivation layer on the entire elongated bodies and tip ends of the elongated nanostructures of the array;
   depositing a complementary carrier selective contact on the second passivation layer and on the elongated bodies and tip ends of the elongated nanostructures of the array; and
   depositing a transparent conductive oxide layer on the complementary carrier selective contact.

2. The method of claim 1, further comprising repeating the steps of disposing, etching and encompassing on the wafer substrate to form a plurality of elongated nanostructure arrays therefrom.

3. The method of claim 1, further comprising passivating the wafer substrate using a process selected from the group consisting of: annealing the wafer substrate in an atmosphere of silane and ammonia, depositing a thin film of amorphous silicon atop the first surface of the wafer substrate, treating the first surface of the wafer substrate in a solution of ammonium sulfide and elemental sulfur; and forming a self-assembled monolayer of unfunctionalized or functionalized alkanethiols on the first surface of the wafer substrate.

4. The method of claim 3, wherein the step of passivating of the wafer substrate is conducted at least prior to deposition of the carrier selective and complementary carrier selective contacts.

5. The method of claim 3, wherein the passivation of the wafer substrate and deposition of the complementary carrier selective contact occur prior to the removal of the elongated nanostructure array from the wafer substrate.

6. The method of claim 1, wherein the etching of the elongated nanostructures comprises a technique selected from the group of: metal assisted chemical etching and anisotropic wet etching.

7. The method of claim 1, wherein the III-V semiconducting material is selected from the group of: GaAs and InP.

8. The method of claim 1, wherein the mask material is formed of a corrosion resistant metal selected from the group of: gold, silver and platinum; or a photoresist selected from the group of: silicon oxide and silicon nitride.

9. The method of claim 8, wherein the etch is performed using a combination of an oxidizer selected from the group of: potassium nitrate, hydrogen peroxide, halogens, potassium dichromate, and potassium permanganate; and a corrosive selected from the group of: ammonia, sulfuric acid, hydrochloric acid, nitric acid, phosphoric acid, and citric acid.

10. The method of claim 9, wherein an etch material for the etch further comprises an additive selected from the group of: thiols and selenides.

11. The method of claim 10, wherein the polymeric layer is formed from a material selected from the group of: PDMS, PMMA and polyimide.

12. The method of claim 1, wherein the carrier selective and complementary carrier selective contacts are formed using a technique selected from the group of: spin coating, PECVD, evaporation, atomic layer deposition and sputtering.

13. The method of claim 1, wherein the carrier selective and complementary carrier selective contacts are separately one of either an electron selective contact or a hole selective contact.

14. The method of claim 1, wherein the carrier selective and complementary carrier selective contacts are separately formed from a material selected from the group of: $TiO_2$, $WO_3$, SnO2, phosphorous doped amorphous silicon, ZnTe, CuI, CuSCN, NiO, and boron doped amorphous silicon.

15. The method of claim 1, wherein the conductive layer is formed from a metal selected from the group of: copper, gold and silver.

16. The method of claim 1, wherein the transparent conductive oxide is ITO.

17. The method of claim 1, wherein the elongated nanostructures are formed having a nanostructure height of from 0.5 µm to 5 µm, a distance between nanostructures of from 100 nm to 1 µm, a tip width of from 10 nm to 100 nm, and a base width of from 100 nm to 800 nm.

18. The method of claim 1, wherein the elongated nanostructures are formed having a nanostructure height of about 1.5 µm, a distance between nanostructures of about 600 nm, a tip width of about 50 nm, and a base width of about 350 nm.

19. The method claim 18, wherein the III-V semiconducting material is GaAs, the carrier selective contact is formed of ZnTe and the complementary selective contact is formed of $TiO_2$.

* * * * *